United States Patent [19]

Erdeljac et al.

[11] Patent Number: 5,436,179

[45] Date of Patent: Jul. 25, 1995

[54] SEMICONDUCTOR PROCESS FOR MANUFACTURING SEMICONDUCTOR DEVICES WITH INCREASED OPERATING VOLTAGES

[75] Inventors: John P. Erdeljac, Plano; Louis N. Hutter, Richardson, both of Tex.

[73] Assignee: Texas Instruments Incorporated, Dallas, Tex.

[21] Appl. No.: 177,888

[22] Filed: Jan. 5, 1994

[51] Int. Cl.$^6$ .......................................... H01L 21/331
[52] U.S. Cl. ....................................... 437/31; 437/27; 437/150; 437/154; 437/909; 148/DIG. 10
[58] Field of Search .................... 437/27, 31, 32, 59, 437/909, 917, 150, 154; 148/DIG. 10, DIG. 11

[56] References Cited

U.S. PATENT DOCUMENTS 4,980,304  12/1990  Chin et al. .............................. 437/31
5,208,169  5/1993  Shah et al. ............................. 437/31

Primary Examiner—Brian E. Hearn
Assistant Examiner—Tuan Nguyen
Attorney, Agent, or Firm—W. James Brady, III; Richard L. Donaldson

[57] ABSTRACT

A bipolar transistor is formed on a substrate of a first (P) conductivity type by: forming a collector region (20) of the second conductivity type (N) in the substrate; forming an adjust region (27) of the first (P) conductivity type in the collector region (20); forming a base region (36) of the first (P) conductivity type in the collector region (20), the base region (36) containing the adjust region (27); and forming an emitter region (11) of the second (N) conductivity type in the adjust region (27). The base region (36) is deeper than and more heavily doped than the adjust region (27). The adjust region (27) alters the doping profile of the base-collector junction on the collector (20) side of the junction to increase the breakdown voltage of the transistor.

7 Claims, 24 Drawing Sheets

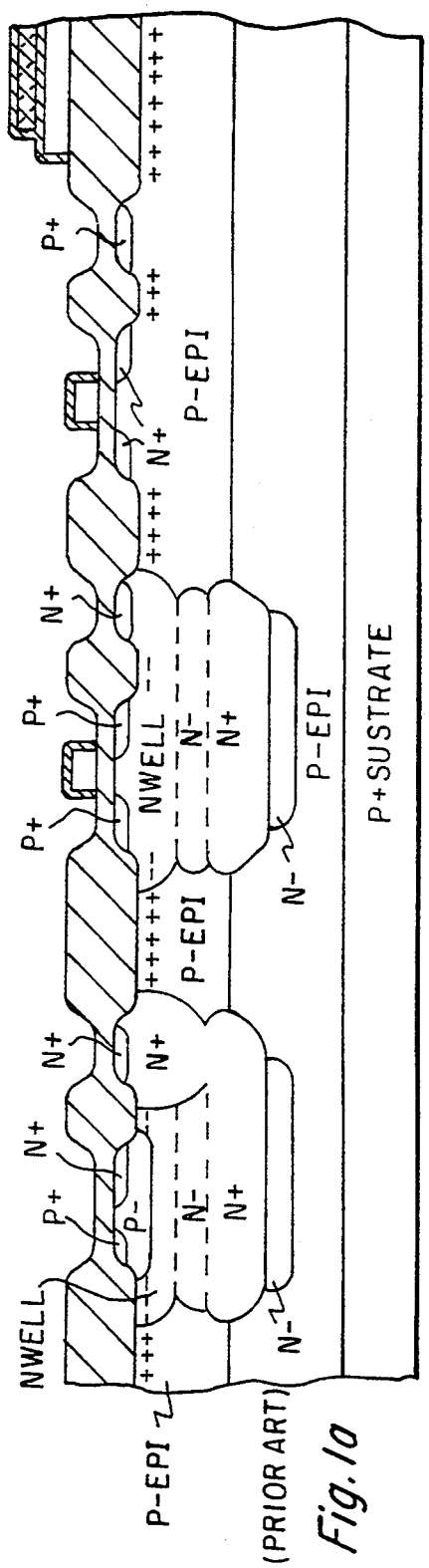
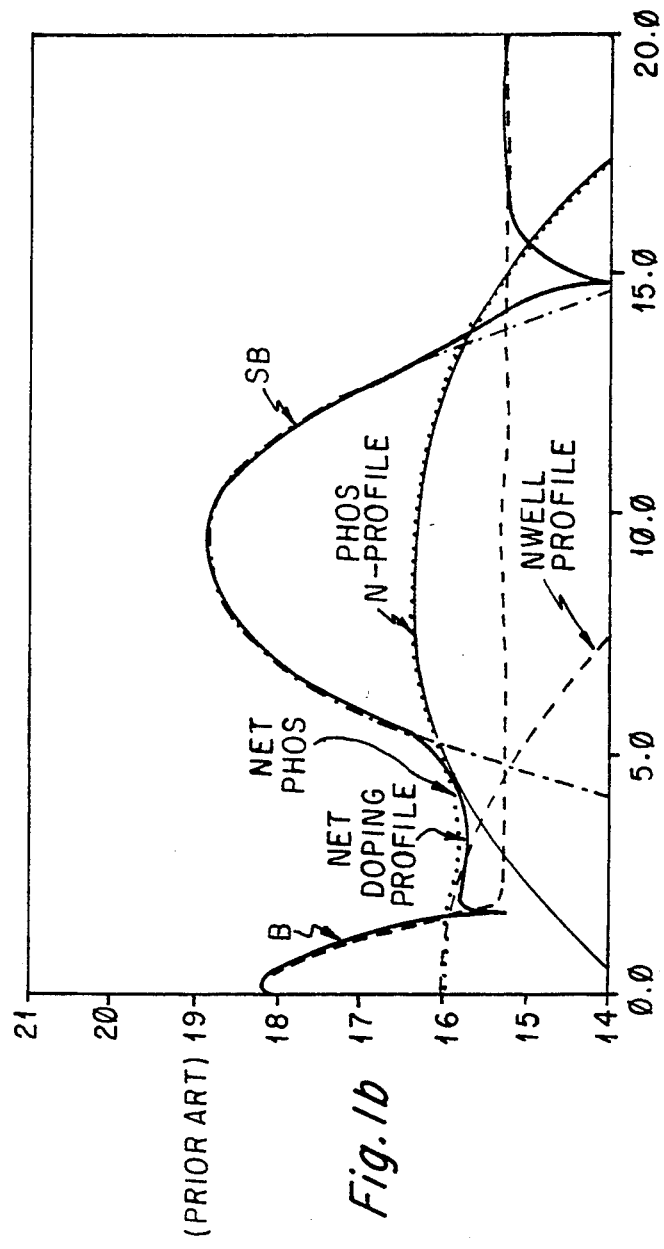
Fig. 1a (PRIOR ART)
Fig. 1b (PRIOR ART)

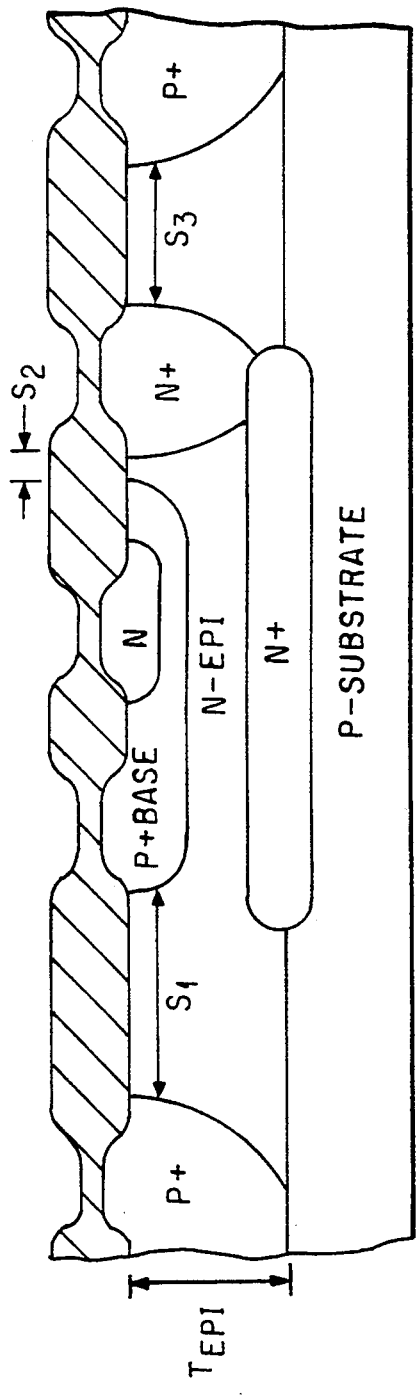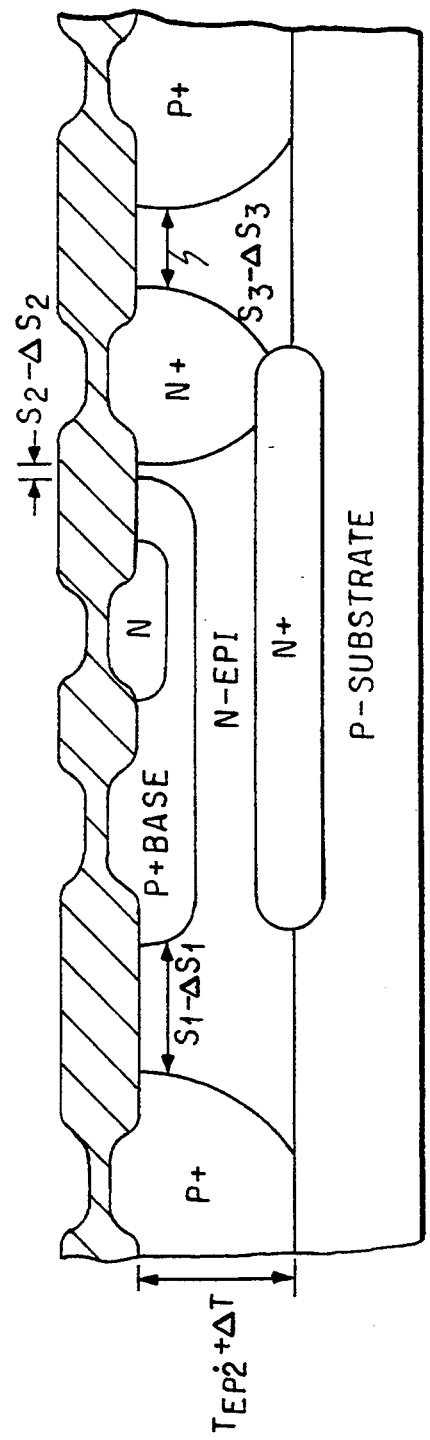

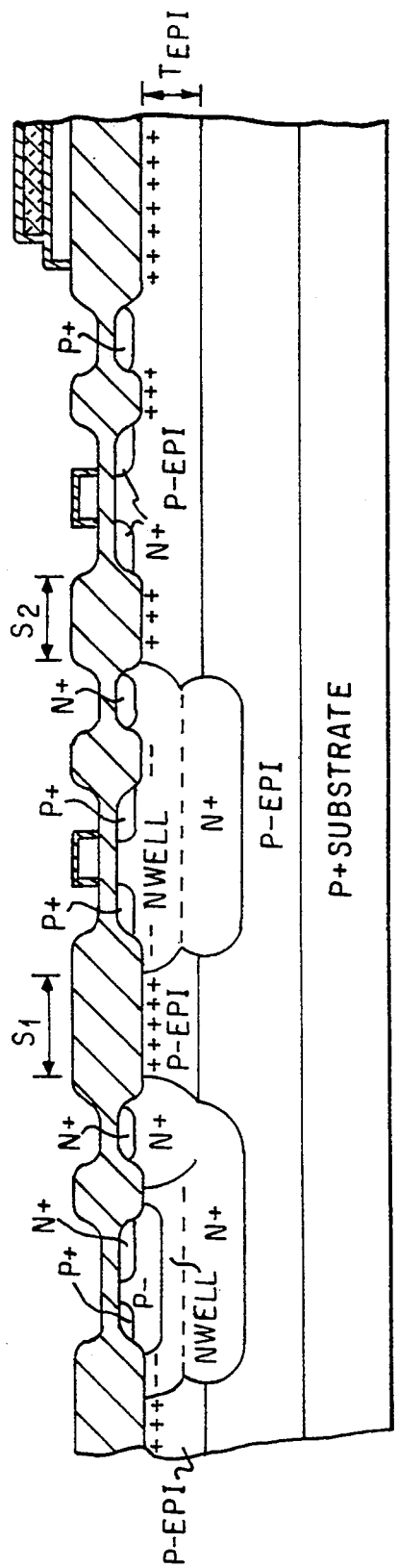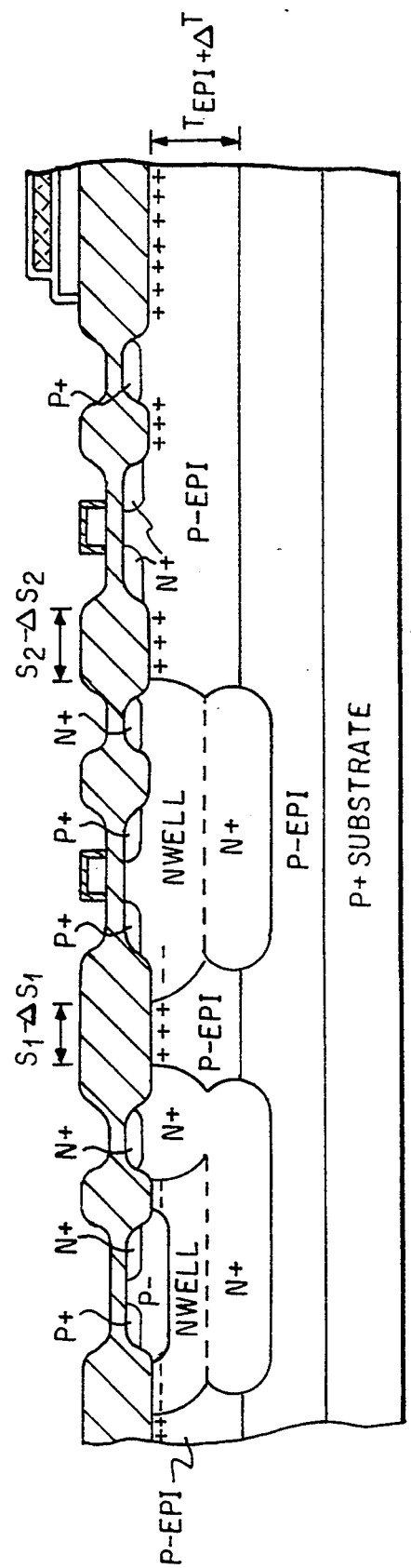
Fig. 3a (PRIOR ART)
Fig. 3b (PRIOR ART)

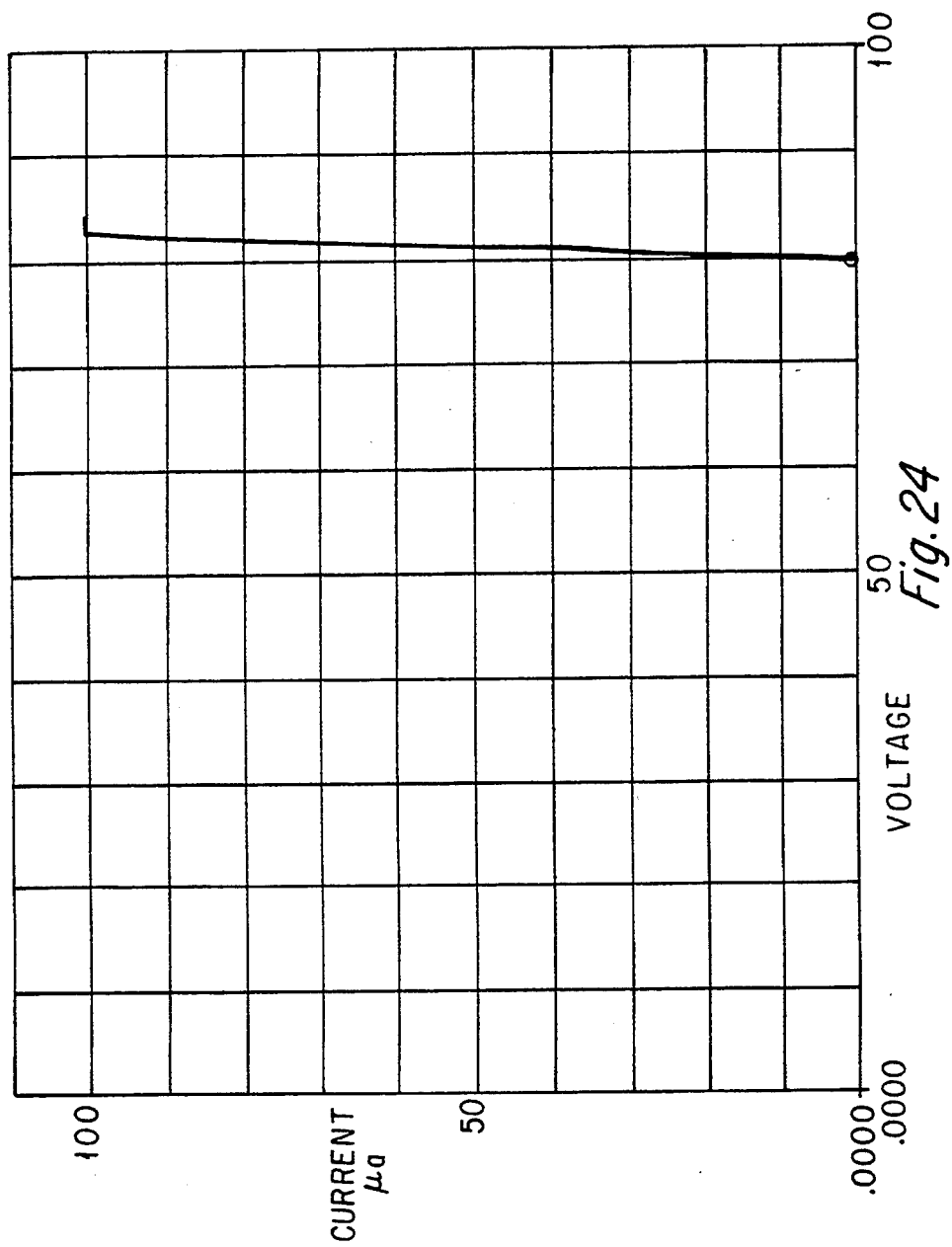

SEMICONDUCTOR PROCESS FOR MANUFACTURING SEMICONDUCTOR DEVICES WITH INCREASED OPERATING VOLTAGES

FIELD OF THE INVENTION

This invention relates generally to semiconductor processes and structures and more specifically to a semiconductor process for building devices with increased operating voltages in BiCMOS and Bipolar integrated circuits.

BACKGROUND OF THE INVENTION

A major trend in the electronic community is to scale to smaller sizes while integrating more functions onto a single integrated circuit. This demands a process that can offer both high performance analog and digital capabilities, e.g. a BiCMOS process. Some advantages of such a process are increased performance, reduced system size and improved system reliability. One result of the trend to higher integration is that supply potentials must also decrease,. However, in many analog applications, existing restraints force the supply potentials to remain at values greater than 5, 10 or 20 volts. In some cases the circuits may be required to withstand a bias of 30 volts or greater.

A second trend in the electronic community is toward a system approach for circuit design. This approach requires the use of many standard cell designs in the design and production of BiCMOS devices. This allows sub-circuits that have been characterized and placed in a library to be used in many designs.

The process for many bipolar circuits developed for a particular operating voltage must be changed, however, in order for the operating voltage to be increased. This requirement is in conflict with the standard cell design approach, since changing the process requires new cell design and recharacterization.

The primary measure of the potential operating voltage of a bipolar NPN transistor is the breakdown voltage between the collector and emitter with the base opened (BVceo). Typically it is this breakdown voltage that limits the operating voltage. In order to increase the operating voltage of the transistor and thereby t, he circuit, it becomes necessary to increase the BVceo.

One technique for accomplishing this is to increase the epitaxial thickness that is deposited in the bipolar process. Such a technique is described in a related pending application, TI-13876, filed Sep. 25, 1989, under Ser. No. 07/411,782, which is incorporated herein by reference thereto. This approach involves increasing the epitaxial thickness without modifying the Nwell that is used for the lower voltage CMOS and bipolar components. Instead of driving the Nwell deeper to meet the up-diffusing N+BL, an additional phosphorus implant is incorporated in the N+BL. This phosphorus diffuses faster than the antimony N+BL. This results in the phosphorus bridging the gap between the unmodified Nwell and the N+BL. This structure is depicted in FIG. 1a along with a doping profile through the higher-voltage NPN transistor base-collector regions (FIG. 1b). Indicated on the doping profile is the phosphorous n-profile and the Nwell profile. These two profiles combine to form the net phosphorous doping profile while allowing the n+ buried layer (Sb) to meet with the Nwell.

Since the thickness of the epitaxial layer is increased, the operating voltage of the circuit also increases due to an increase in the BVcbo(bulk) term in the relationship:

$$BV_{ceo} = \frac{BV_{cbo}(\text{bulk})}{(hFE)^{\frac{1}{n}}}$$

Here, BVcbo(bulk) is the thickness-limited breakdown voltage between the N+ buried collector and base with the emitter open that occurs at the planar or bottom of the base-collector junction. This portion of the collector-base junction is where the current flows in a vertical bipolar transistor. The planar breakdown of this portion is independent of the radius of curvature of the junction. The hFE is the common-emitter current gain of the transistor, and n is a process dependent empirical parameter typically on the order of 3 to 6.

While this approach does address the issue of not altering the design rules of the lower voltage CMOS and bipolar structures, it does require an increase in the epitaxial thickness. This increase in the epitaxial thickness results in additional collector series resistance. In the case of bipolar transistors, especially high current transistors, this additional series resistance can be detrimental since it degrades the current carrying capability of the device at a particular voltage. It is not possible to selectively build higher voltage structures with this technique since the epitaxial thickness can not be selectively increased in some areas of the circuit while remaining unchanged in others. Therefore, all bipolar transistors, higher voltage and lower voltage, are affected in terms of their series resistance. Therefore, while the lower voltage design rules are unaffected, the circuit models of the lower voltage circuits need to be adjusted for this series resistance. It may be possible that, after making the alteration to the lower voltage circuit model, the circuit performance is detrimentally affected.

Another approach to increase BVceo is to decrease the hFE of the devices. This, however, is typically not a practical solution since the trade-off between operating voltage and the gain of the device is not desirable due to degraded performance of the transistor.

The BVceo of the NPN bipolar transistor can be increased if the n+ buried layer is removed or its doping level greatly reduced due to the increase in the thickness-limited BVcbo(bulk). However, high collector series resistance and reduced NPN performance would result.

A disadvantage of increasing the epitaxial thickness in a typical prior art buried collector bipolar process is that as the epitaxial thickness is increased, the need exists to diffuse the p-type isolation a greater distance. This also produces an increase in the lateral diffusion of the isolation, thereby increasing design rules in terms of the distance between each diffusion and isolation region. Thus, the transistor size would be scaled to larger dimensions. This is depicted in FIGS. 2(a) and 2(b). As can be seen when comparing the two structures, several spacings have been affected by the increased diffusion necessary to obtain adequate isolation for the thicker epitaxial layer. An increase in the design rules of the low voltage device as well as the high voltage device would be required because of the increased lateral diffusion.

Since bipolar-oriented BiCMOS processes suffer from poor packing densities due to the use of thicker epitaxial layers and the need for deep p+ isolation similar to that shown in FIG. 2(b), many advanced BiCMOS processes are CMOS-oriented, where the CMOS process is Nwell based (i.e. Nwell BiCMOS process). The Nwell BiCMOS process allows the NPN collector region to be self-isolating with the p-epitaxial layer acting as the isolation region. Also, Nwell CMOS processes are commonly used in analog and digital applications. Therefore, this choice of starting process can minimize the amount of device re-characterization needed after merging bipolar components.

In order to increase the operating voltage of the bipolar transistors in an Nwell BiCMOS process, a similar approach could be taken to increase the epitaxial layer, resulting in a higher-voltage Nwell BiCMOS process. FIG. 3(a) shows a standard BiCMOS cross-section, while FIG. 3(b) shows the same type of structure with a higher voltage capability resulting from a thicker epitaxial layer. As in the bipolar process, if the epitaxial thickness is increased, the Nwell must be driven deeper into the epitaxial layer in order to meet the up diffusing n+ buried layer (N+BL). Since the Nwell is used as the well to house the vertical NPN transistor as well as the PMOS transistors, any alterations made to this region would affect not only the bipolar devices, but also the CMOS devices. Additional heat cycling would be needed to ensure that the up diffusing N+BL would meet the down-diffusing Nwell. As in the bipolar process, an increase in the lateral diffusion and, hence, design rules for both the existing low voltage bipolar and CMOS components would result.

In a BiCMOS process where it is necessary to increase the voltage of the bipolar devices and remain compatible with the standard cell methodology, this would not be acceptable. The purpose for a standard cell methodology is to decrease design times and increase success. Therefore, the technique for obtaining higher voltage operation must not impact the current low voltage cells, but must still enhance the process to produce higher voltage operation, thus maintaining compatibility with a standard cell methodology. The approach of indiscriminately increasing the epitaxial thickness would be unacceptable when conforming to a standard cell methodology.

Furthermore, in a bipolar process there comes a point at which increasing the epitaxial thickness no longer brings adequate returns in terms of increasing the operating voltage of the transistor. This is referred to as non-thickness limited breakdown between the base and the collector. The technique used to increase the operating voltage or BVceo of this transistor is to increase the epitaxial resistivity. An increase in resistivity, or decrease in doping level, reduces the slope of the electric field within the epitaxial layer, thereby increasing the amount of voltage that can be dropped across a given distance. This reduction in the doping level of the epitaxial layer lowers punchthrough voltages within the silicon, necessitating increased distances between diffusions of the same type. Since in a BiCMOS process the epitaxial layer is used in a different manner (i.e. it forms the isolation between adjacent devices) this approach would not produce the same result. Regardless, if the epitaxial resistivity were changed the same alteration in punchthrough voltages would occur making it a non-viable possibility for standard cell design strategies.

BRIEF DESCRIPTION OF THE DRAWINGS

In the drawings:

FIG. 1a is a cross-section of a prior art BiCMOS structure with an additional phosphorus implant in the N+ buried layer;

FIG. 1b is the doping profile of the NPN transistor shown in FIG. 1a;

FIG. 2a is a cross-sectional view of a prior art NPN transistor with a standard buried collector;

FIG. 2b is a cross-sectional view of the NPN transistor of FIG. 1a built in a thicker epitaxial layer;

FIG. 3a is a cross-section of a prior art BiCMOS structure;

FIG. 3b is a cross-section of the BiCMOS structure of FIG. 3a built in a thicker epitaxial layer;

FIG. 24 shows the characteristics of an isolated NMOS transistor made in accordance with the present invention

DETAILED DESCRIPTION OF THE PREFERRED EMBODIMENT

The process of the present invention advantageously provides the ability to selectively build higher voltage bipolar transistors in an Nwell BiCMOS process where the existing design rules and models of the original lower voltage process would not be affected. Whereas the approach taken by the known prior art was to increase the epitaxial thickness, thereby increasing the BVcbo(bulk) term in the empirical equation for BVcbo, the present invention does not rely on the modification of the BVcbo(bulk) term. The present invention does not require increasing the epitaxial thickness to obtain the additional operating voltage. The present invention increases the BVcbo by addressing the empirical process dependent "n" value in the equation previously stated:

$$BV_{ceo} = \frac{BV_{cbo}(\text{bulk})}{(hFE)^{\frac{1}{n}}} \quad (1)$$

This empirical constant results from an empirical representation of the base-collector multiplication factor "M".

$$M = \frac{1}{1 - \left(\frac{Vcb}{BVcbo}\right)^n} \quad (2)$$

Where, M is the multiplication factor, Vcb is the potential difference across the collector-base junction, n is the process dependent empirical constant, and BVcbo is the planar breakdown of the collector-base junction (previously named BVcbo(bulk)). Near breakdown, the current normally flowing in the reverse biased collector-base junction is multiplied by the multiplication factor M because of the incipient avalanche process. When the conditions necessary for the current to rapidly increase are analyzed in conjunction with equation (2) above the result is the empirical relationship stated in equation (1). The key element being; that the empirical n value indicated in equation (1) is exactly the same empirical value indicated in equation (2). The value of n in equation (2) is dependent on the doping at the base-collector junction. Therefore, by modifying the doping profile near the base-collector junction, the value of n can be adjusted.

Turning to Table 1, there are shown the major process steps in a known baseline BiCMOS process flow. This flow outlines a known CMOS-driven BiCMOS process where the high-temperature bipolar steps are performed prior to the critical CMOS implants (i.e. channel stop, threshold adjusts, and source/drain). The present invention advantageously does not disturb or alter the baseline process flow.

The implementation of the higher voltage NPN processing module of the present invention with respect to the baseline process flow is shown in Table 2. This implementation adds one masking level and one implant in order for the higher voltage NPN transistors to be selectively generated.

Figure 4:
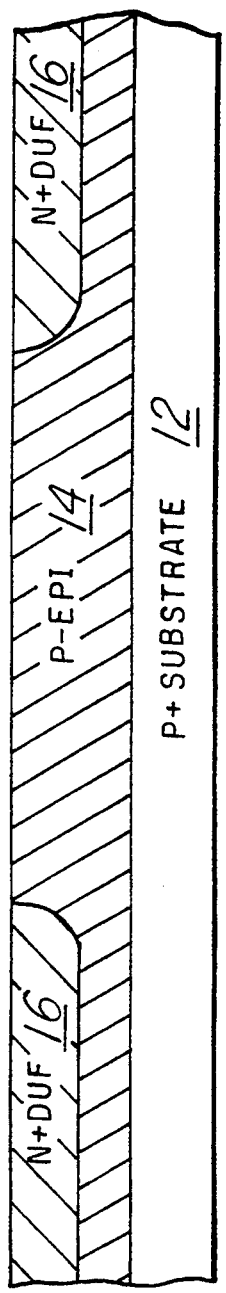
FIGS. 4-9 show a BiCMOS structure at various steps of the fabrication process utilizing the present invention.

FIGS. 4-8 show the cross-sectional view of the high-voltage NPN transistor as it is processed through the high-voltage module of the present invention. In FIG. 4 an epitaxial layer 14 of a first conductivity type has been formed on a substrate 12 of the first conductivity type. The substrate 12 is typically heavily doped P+ type silicon, while the epi layer 14 is lightly doped P− type silicon. An oxide layer (not shown) is formed and patterned in a conventional manner for high energy implants of a second conductivity type, such as antimony, to form N+ buried layers (DUF) 16. A diffusion process is then performed, during which the implanted dopants are diffused into the epi layer 14, forming heavily doped N+ regions 16. The oxide is then stripped, leaving the structure shown in FIG. 4.

Figure 5:
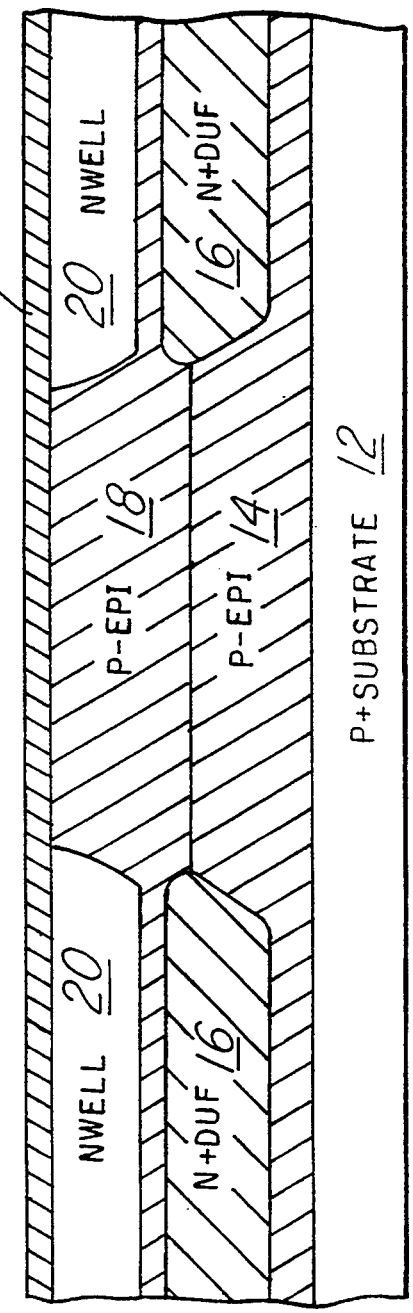

As seen in FIG. 5, a second epitaxial layer 18 of the first conductivity type, preferably a lightly doped P− material is then formed by deposition over the surface of epi layer 14 and N+ buried layers 16. An oxide layer (not shown) is then formed, patterned and etched for subsequent Nwell formation.

A dopant of a second conductivity type, preferably phosphorus, is then implanted into regions 20, to form Nwells. The implant is then diffused to form Nwells 20. As can be seen from FIG. 5, the N+ buried layers 16 also up-diffuse into the second epi layer 18. The resultant structure has an oxide layer 22 formed thereon during the diffusion process.

Figure 6:
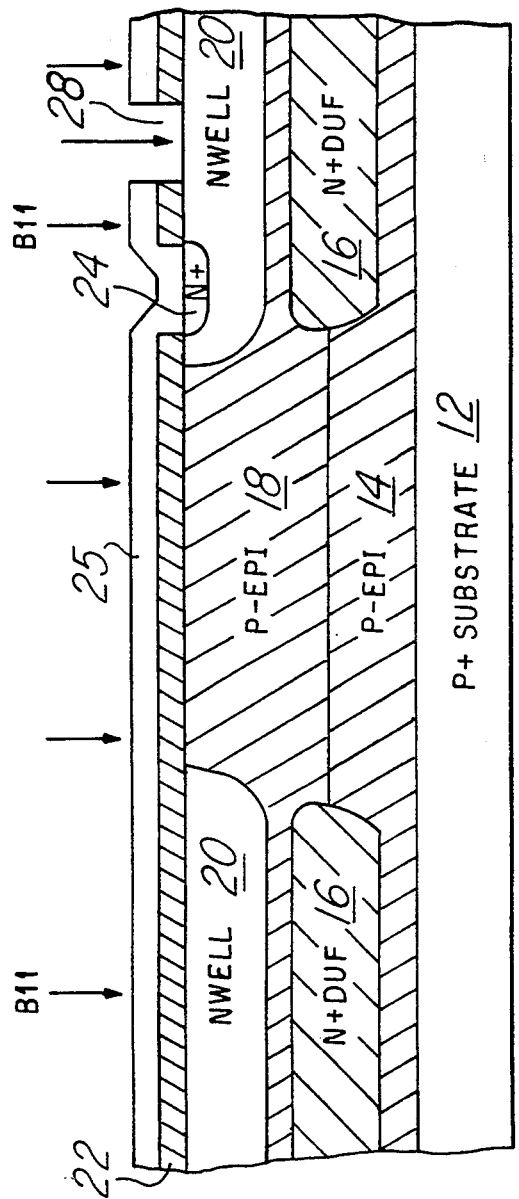
Figure 7:
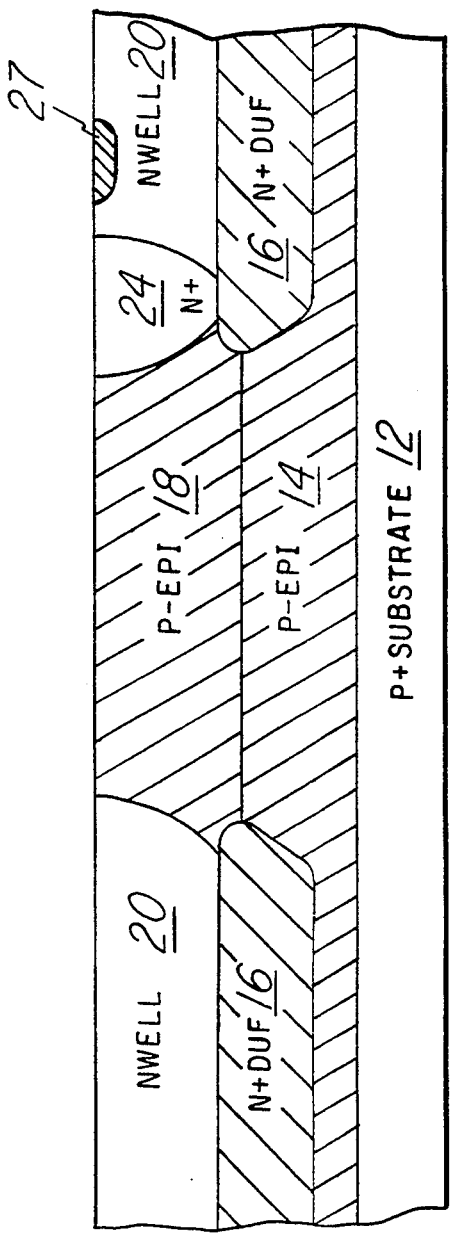

The Oxide layer 22 is patterned and etched and an N+ collector deposition is performed to form N+ collector top contact region 24, shown in FIG. 6. The high-voltage process module of the present invention is then inserted into the baseline process flow as described below.

A layer of photoresist 25 is formed, patterned and etched to form opening 28 over a portion of Nwell 20. An Nwell adjust is formed by implanting a dopant, preferably boron, into a portion of Nwell 20. The boron implant is used to alter the profile of the base-collector junction on the collector side of the junction as is discussed in more detail below. The collector region adjacent to the base is part of Nwell 20. Since the boron implant will adjust the profile of the Nwell region, the boron implant is hereinafter referred to as the Nwell adjust implant.

The Nwell adjust implant must modify the profile of the Nwell 20 in the area of current flow across the base-collector junction. Since the current flow across the base-collector junction in a vertical NPN transistor is determined by the location of the emitter diffusion in the base region, it is necessary that the Nwell adjust pattern for the boron implant be some oversize of the emitter to create an Adjust region 27 of the appropriate size. The necessary amount of oversize will be a function of the alignment control and lateral diffusion specific to the process.

The nwell adjust implant dosage, as well as the implant energy can be modified as needed to meet the requirements to obtain a specific value of n, as is discussed in more detail below with respect to FIGS. 16-24.

After the Nwell adjust implant, a resist clean-up step is performed, followed by TEOS deposition and an N+ collector thermal diffusion to diffuse collector contact region 24. The Nwell adjust implant has also diffused, creating Adjust region 27. The oxide (not shown) formed during the diffusion step is removed, leaving the structure shown in FIG. 7. The N+ buffed layer 16 is in contact with the Nwell 20 and with the deep collector contact region 24.

Figure 8:
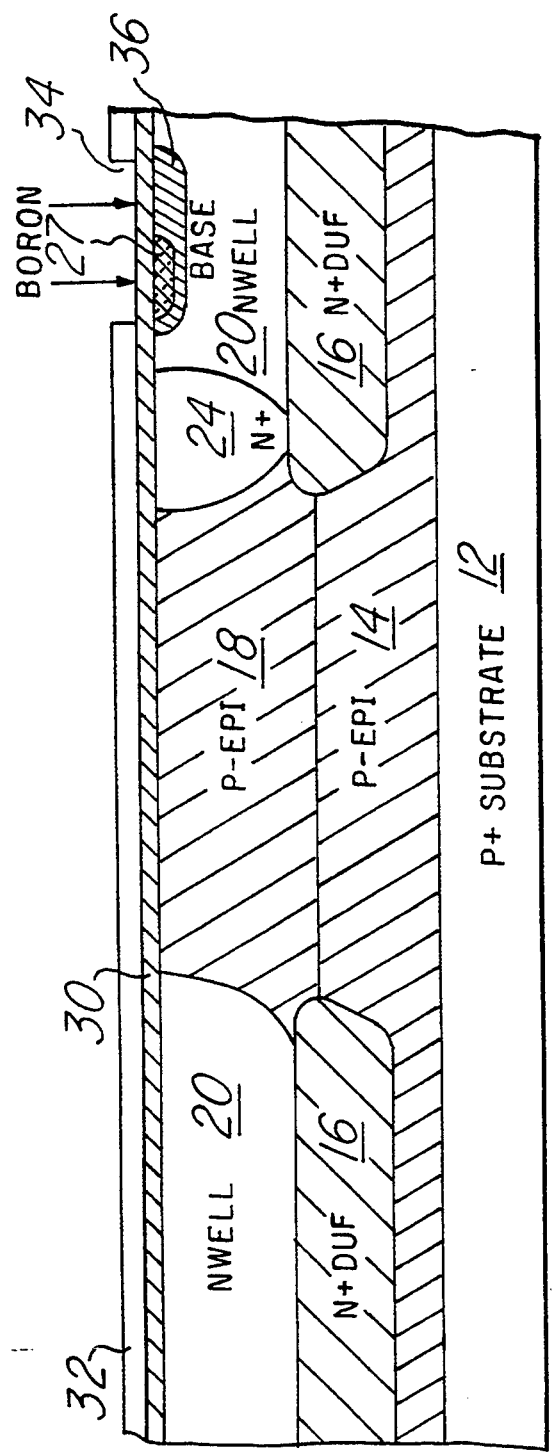

A thin pad oxide layer 30 is then formed as shown in FIG. 8, preferably about 500 Å, by heating the substrate to preferably approximately 1000° C. for 40 min. A layer of resist 32 is formed and patterned leaving an opening 34 where the base will be formed. A base implant is then performed, the dopant preferably being Boron at a dose of 1.0E14 atoms/cm$^2$ at an implant energy of 50 keV. A nitride layer (not shown) is then formed preferably approximately 1400 Å thick, at approximately 800° C. by LPCVD, for example. A base diffusion step is then carried out, preferably for approximately 80 minutes at a temperature of approximately 1100° C. to diffuse the base region 36.

As can be seen in FIG. 8, the base region 36 is deeper than the Nwell adjust region 27, and it is also more heavily doped. This is necessary to minimize the impact the Nwell adjust 27 has on the base region 36. The basic reason for the, nwell adjust region 27 is to modify the nwell profile just below the base region 36, as is explained in more detail below.

Figure 9:
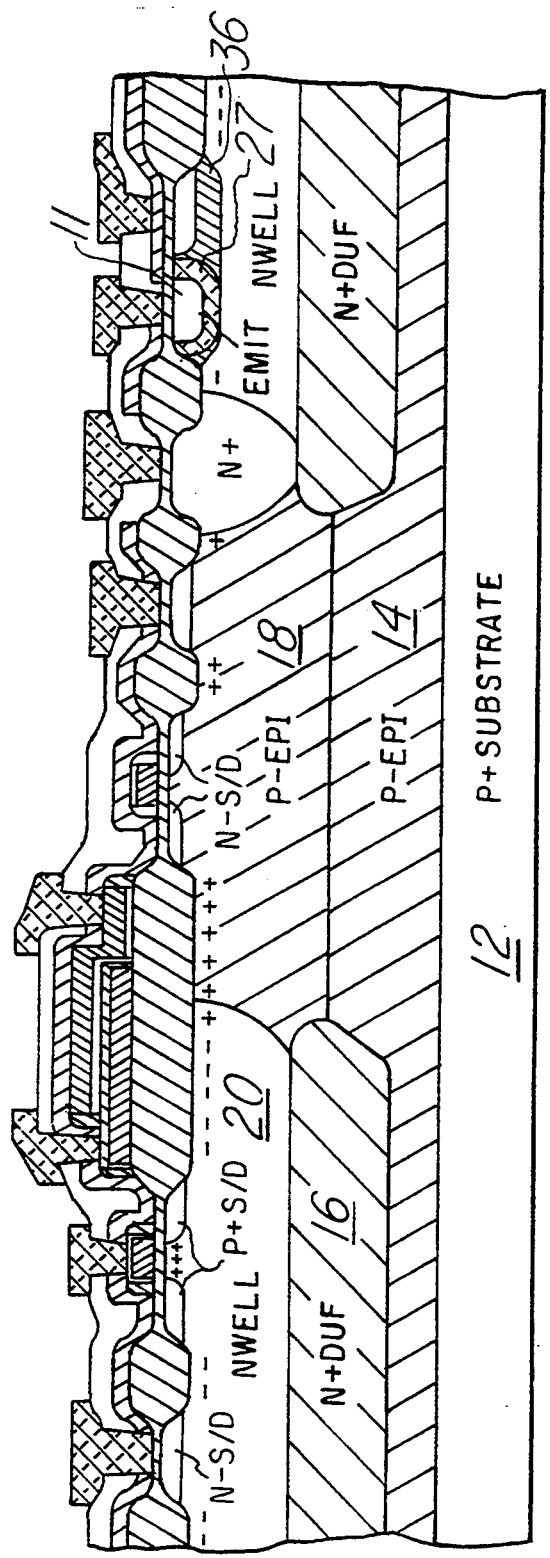

After further processing using known BiCMOS processes shown in Tables 1 and 2, the resulting structure is shown in FIG. 9. An emitter region 11 of N type conductivity is formed in Nwell adjust region 27. As can be seen, the insertion of the process of the present invention did not affect the formation of the CMOS devices.

As previously stated, the nwell adjust implant 27 is used to modify the empirical constant (n) in equations (1) and (2). The modification in the empirical constant is the result of the modification of the collector doping profile near the base-collector junction.

Figure 10:
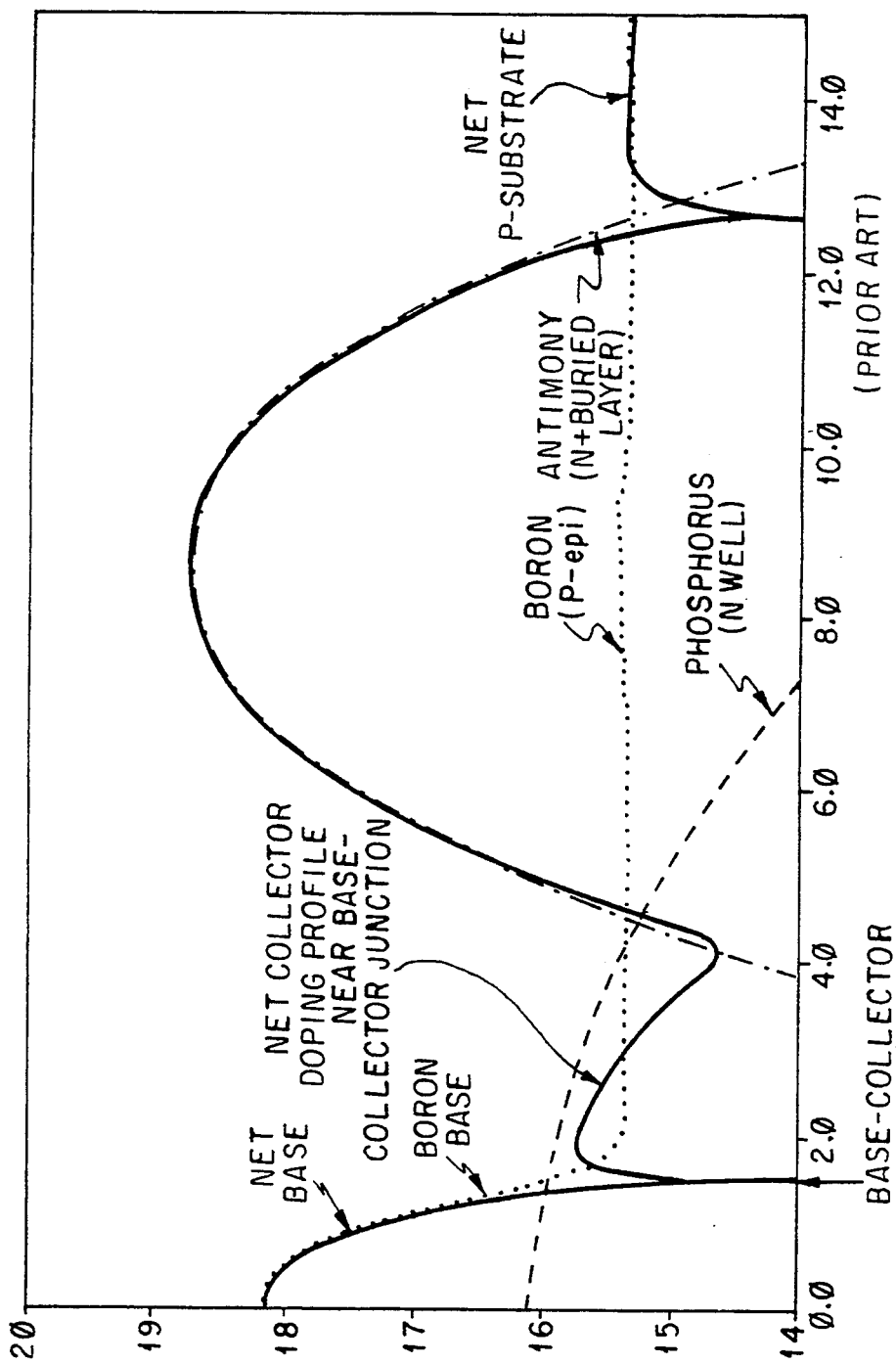
FIGS. 10-11 show the results of modeling the base-collector portion of a prior art NPN transistor.
Figure 11:
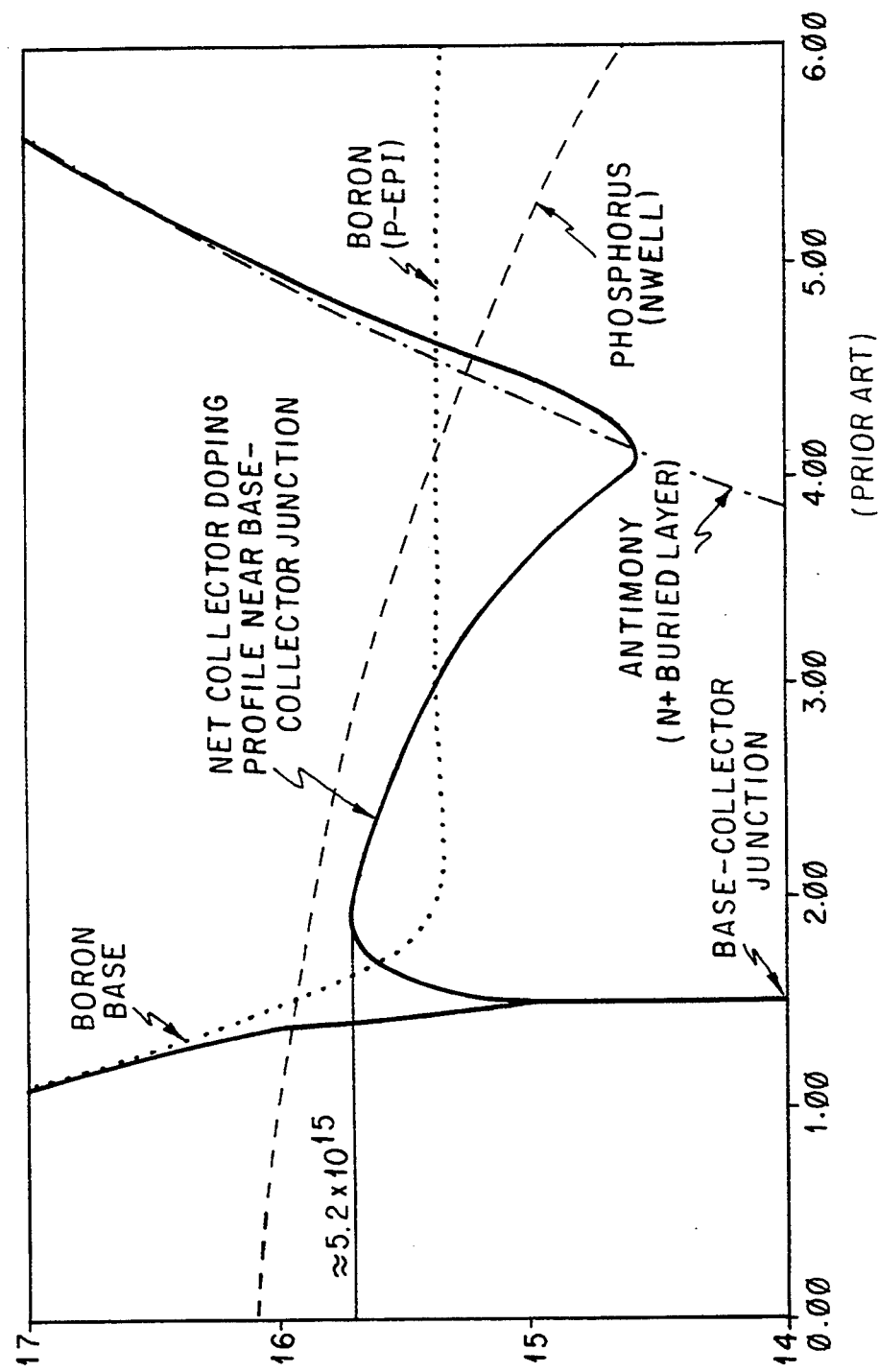
Figure 12:
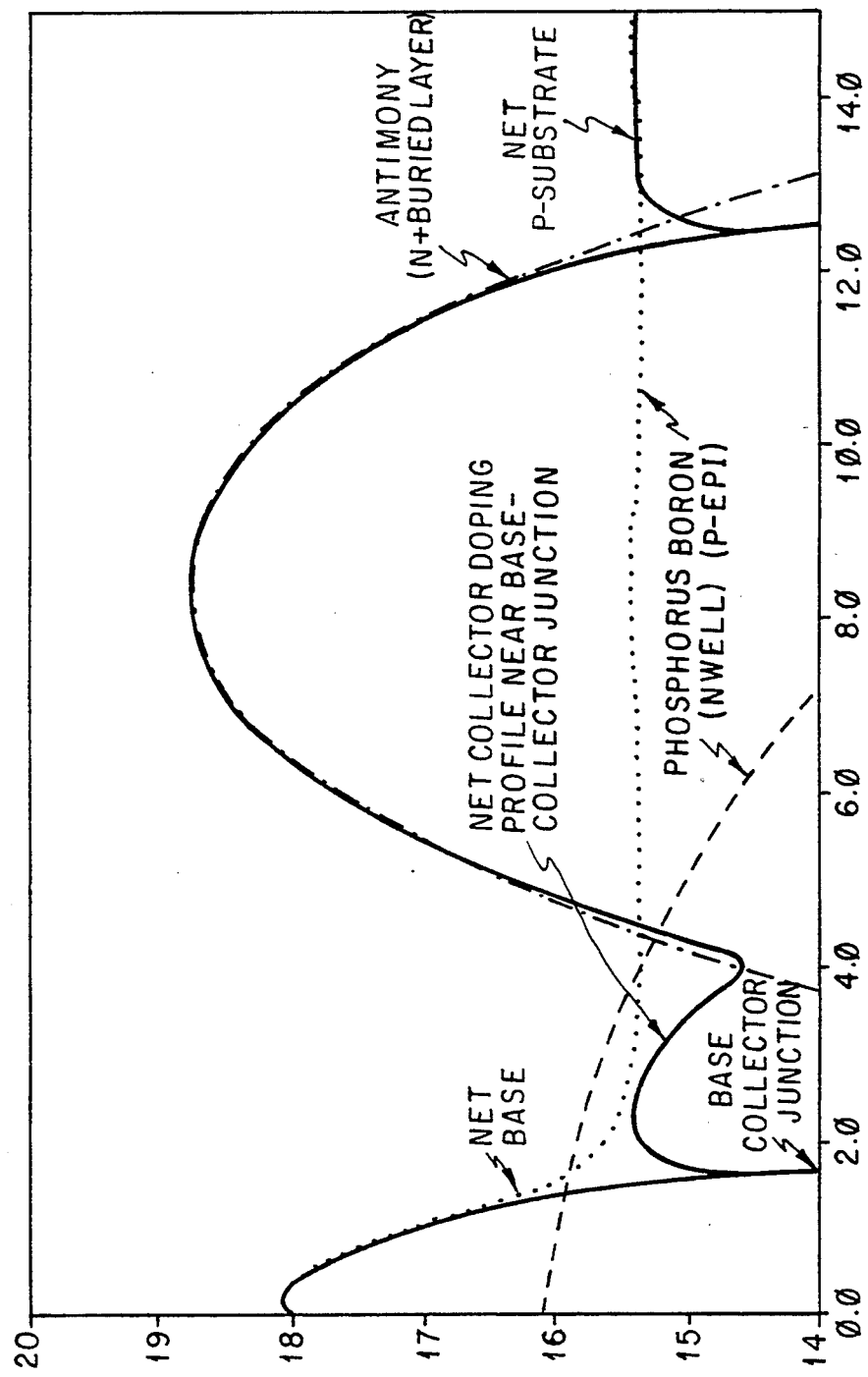
FIGS. 12-13 show the results of modeling the base-collector portion of an NPN transistor formed in accordance with the present invention.
Figure 13:
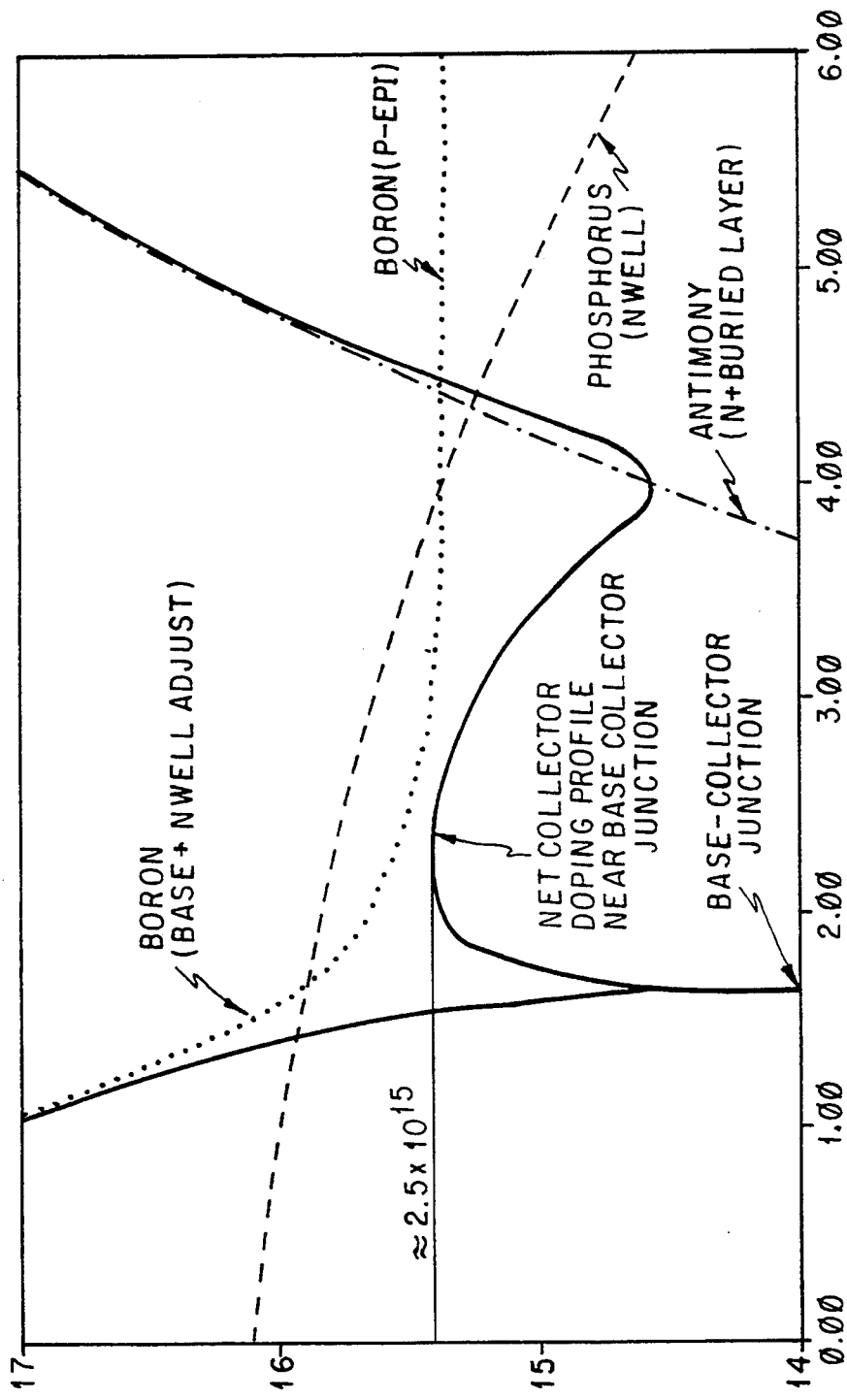

FIGS. 10 and 11 show the base and collector doping profiles of a standard NPN transistor made in accordance with the process flow of Table 1. FIG. 10 shows the doping profiles to a depth of 15 microns, while FIG. 11 is a magnification of the profiles of FIG. 10 to a depth of 6 microns. The impact of the nwell adjust of the present invention on the doping profiles is shown in FIGS. 12 and 13, which are analogous to FIGS. 10 and 11, but for a high voltage NPN transistor formed with the process module of the present invention included in the process flow. The Nwell adjust dose was 2.5E12 atoms/cm$^2$ for the structure having the profiles shown in FIGS. 12 and 13. As can be seen by comparison of FIG. 10 with FIG. 12 and of FIG. 11 with FIG. 13, the nwell adjust implant has modified the collector doping profile near the base-collector junction such that the collector of the higher voltage transistor is not as heavily doped near the base-collector junction. The portion of the nwell adjust profile that affects the collector doping profile is actually the "tail" of the nwell adjust profile. If the nwell adjust profile converts the nwell region from n-type to p-type at a depth deeper than the subsequent base implant the hFE of the device will be greatly impacted. It is therefore important that the nwell adjust region be shallower than the base region, yet deep enough that the "tail" of the profile alters the collector profile adjacent the base-collector junction. As can be seen in FIGS. 11 and 13 the base-collector junction depth increases just slightly from 1.5 micron to 1.6 micron due to the introduction of the nwell adjust implant.

Figure 14:
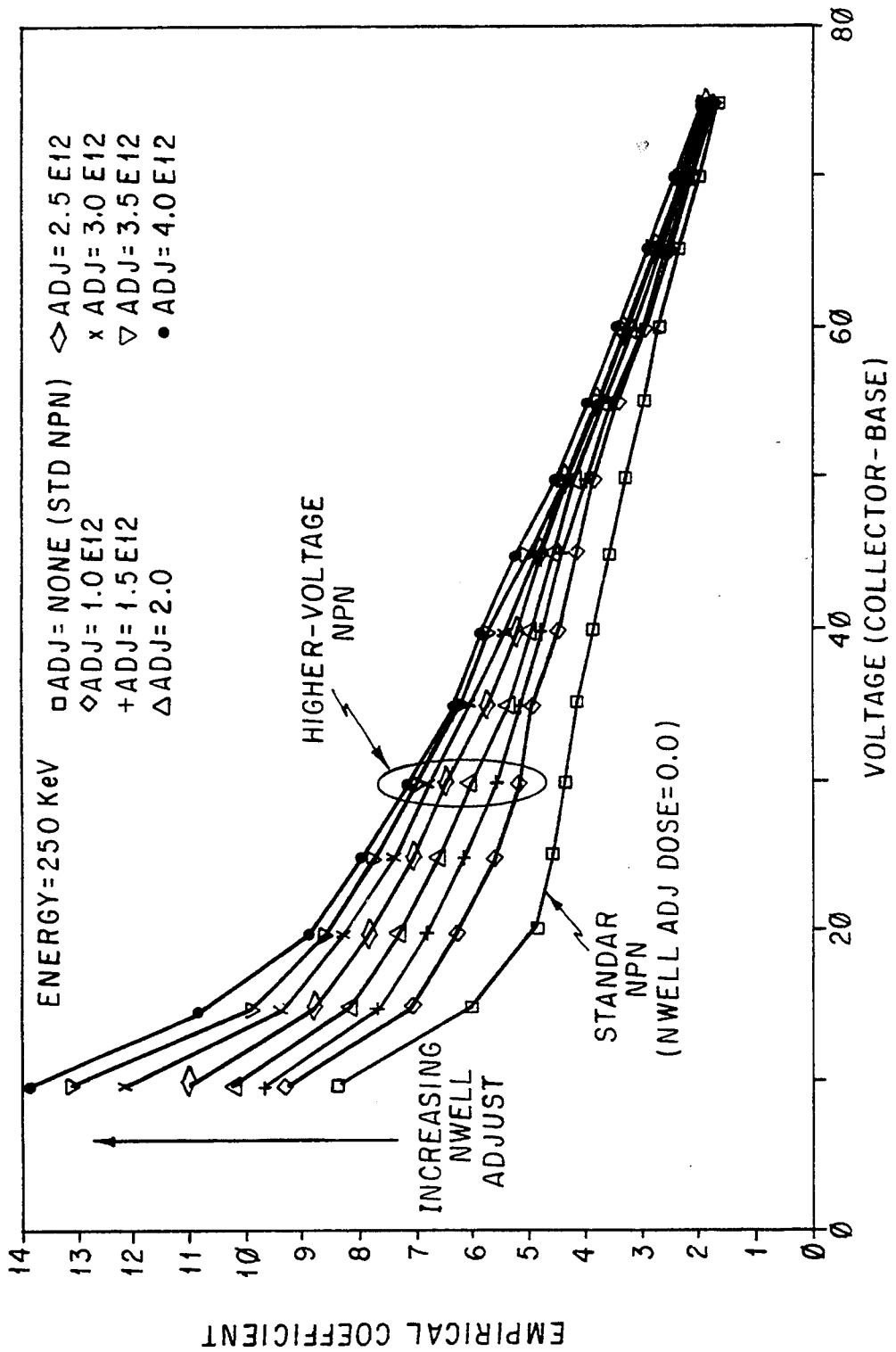
FIGS. 14-20 show certain characteristics of devices made in accordance with the present invention.
Figure 15:
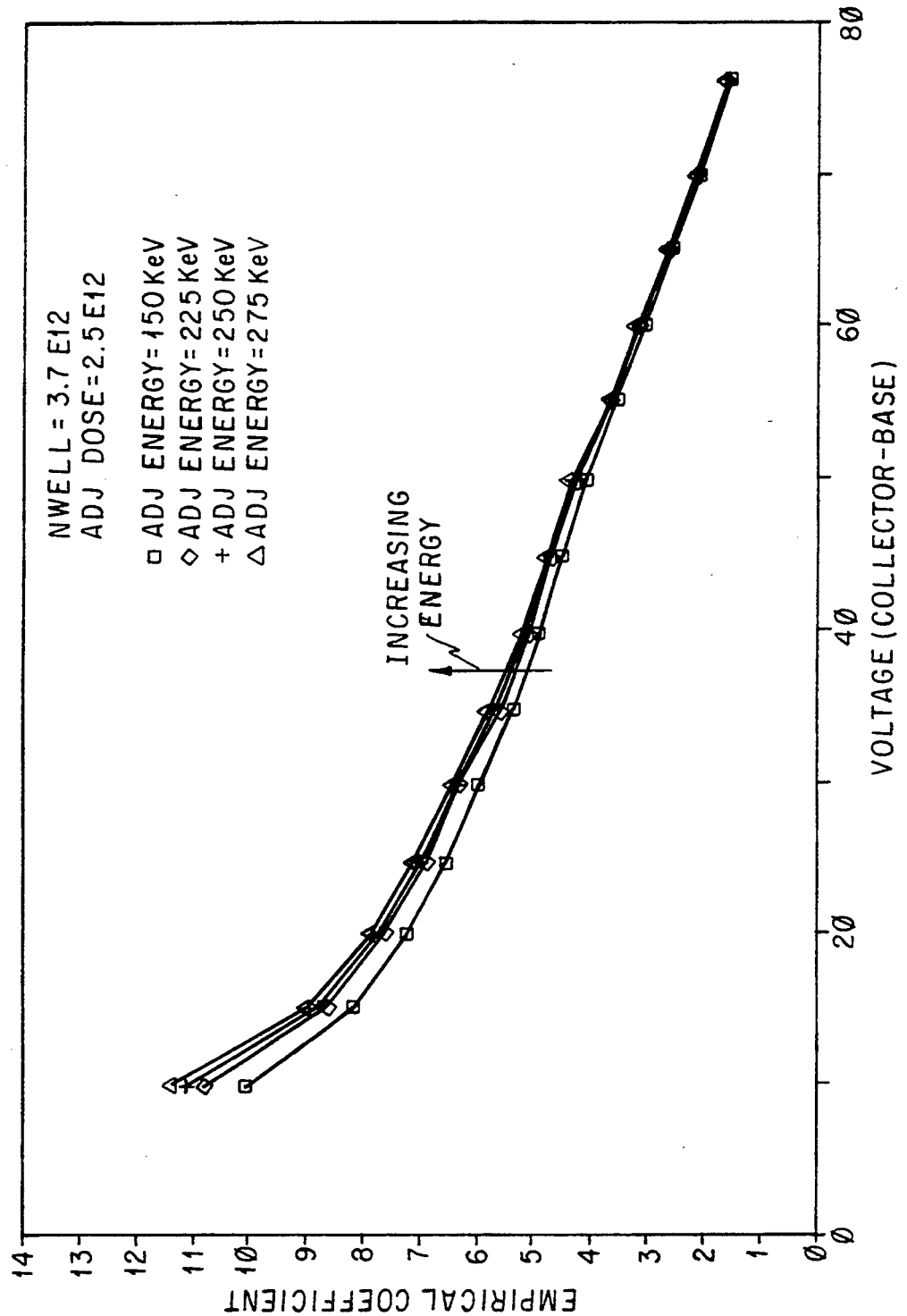
Figure 16:
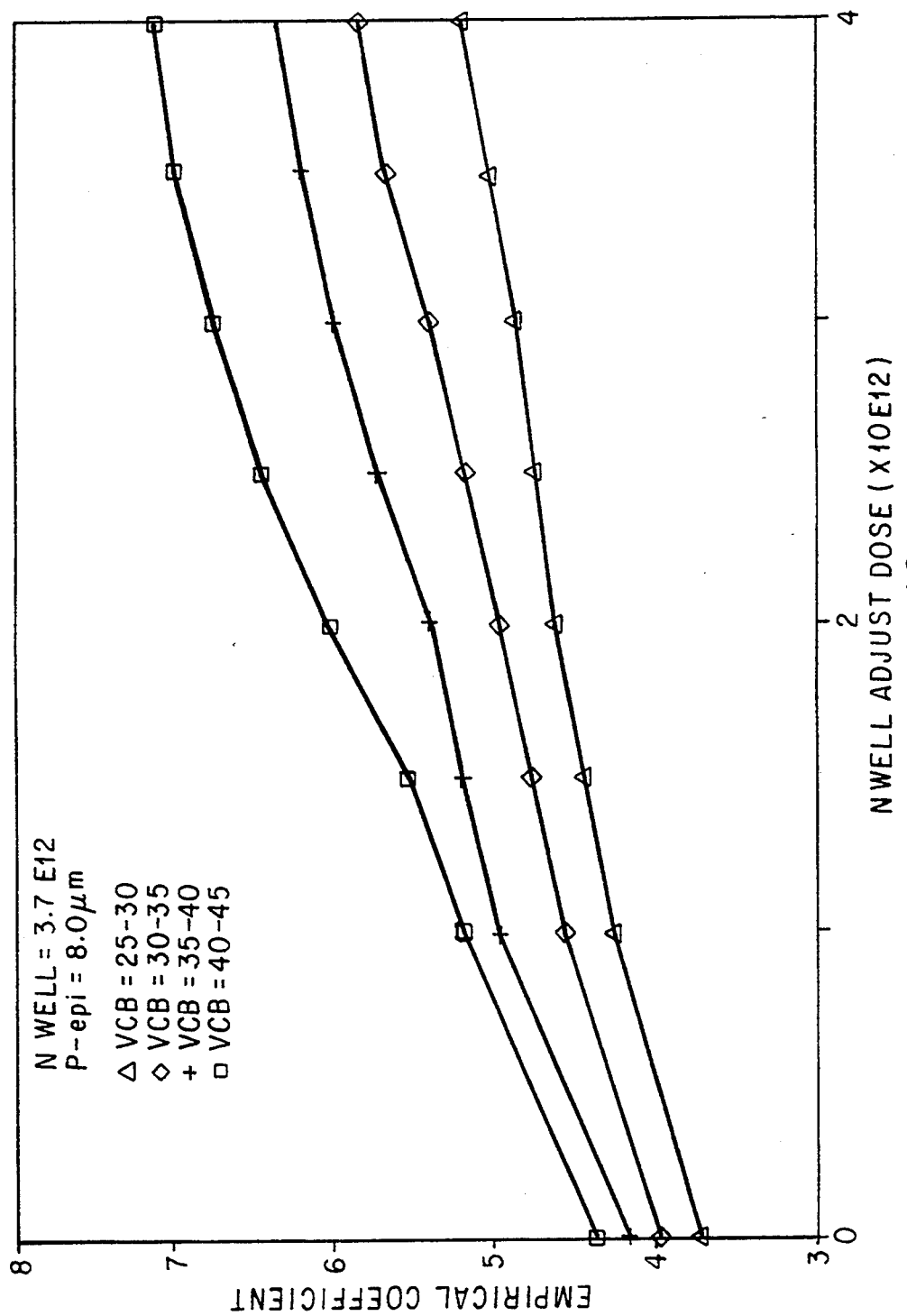

FIGS. 14–16 show the results of modeling with respect to the NPN transistor of the present invention. FIG. 14 shows constant (n) with respect to collector-base voltage, with the nwell adjust implant dosage being varied from no implant to 4.0E12 atoms/cm$^2$. The implant energy in all cases shown in FIG. 14 was 250 KeV. As can be seen, the value of n increases as the nwell adjust implant dosage is increased. FIG. 15 illustrates modeling results for differing implant energies for the same dopant level. FIG. 15 plots the empirical value (n) versus base-collector voltage for implant energies ranging from 150 KeV to 275 KeV, with the nwell adjust dosage a constant 2.5E12 atoms/cm2. As the implant energy is decreased, the n value is decreased. FIG. 16 shows the results of differing nwell adjust dosages for a given base-collector voltage. As indicated, as the adjust dose increases, so does the value of n.

Figure 17:
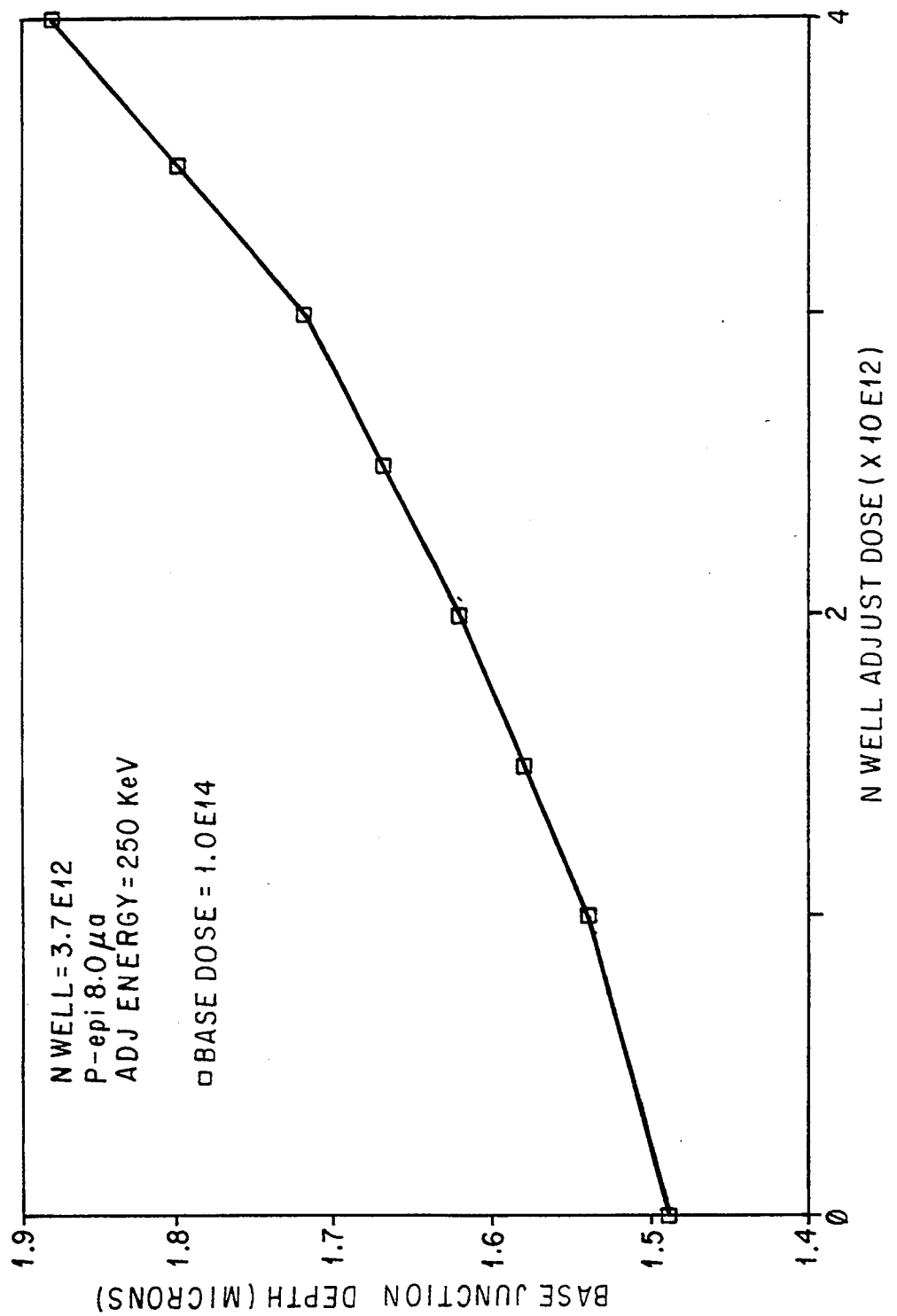

While the modeling results shown in FIGS. 14–16 would indicate an increase in the empirical constant n with a resulting increase in BVceo as the nwell adjust dose is increased, there is an upper limit on the adjust dose. The upper limit is set by the fact that as the nwell adjust dose is increased, the base-collector junction depth, and therefore the hFE of the device are impacted. The relationship between base junction depth and adjust implant dosages is shown in FIG. 17. As the nwell adjust dose is increased, the base junction depth is also increased. This increase in the base junction depth increases the amount of integrated base charge, which decreases the hFE. If the hFE is decreased too much, the device becomes unusable, since the gain will be too low. Using a dose of 3.5E12 atoms/cm$^2$ at an implant energy of 150 Kev, a 15% decrease in hFE is seen compared to a standard NPN.

Figure 18:
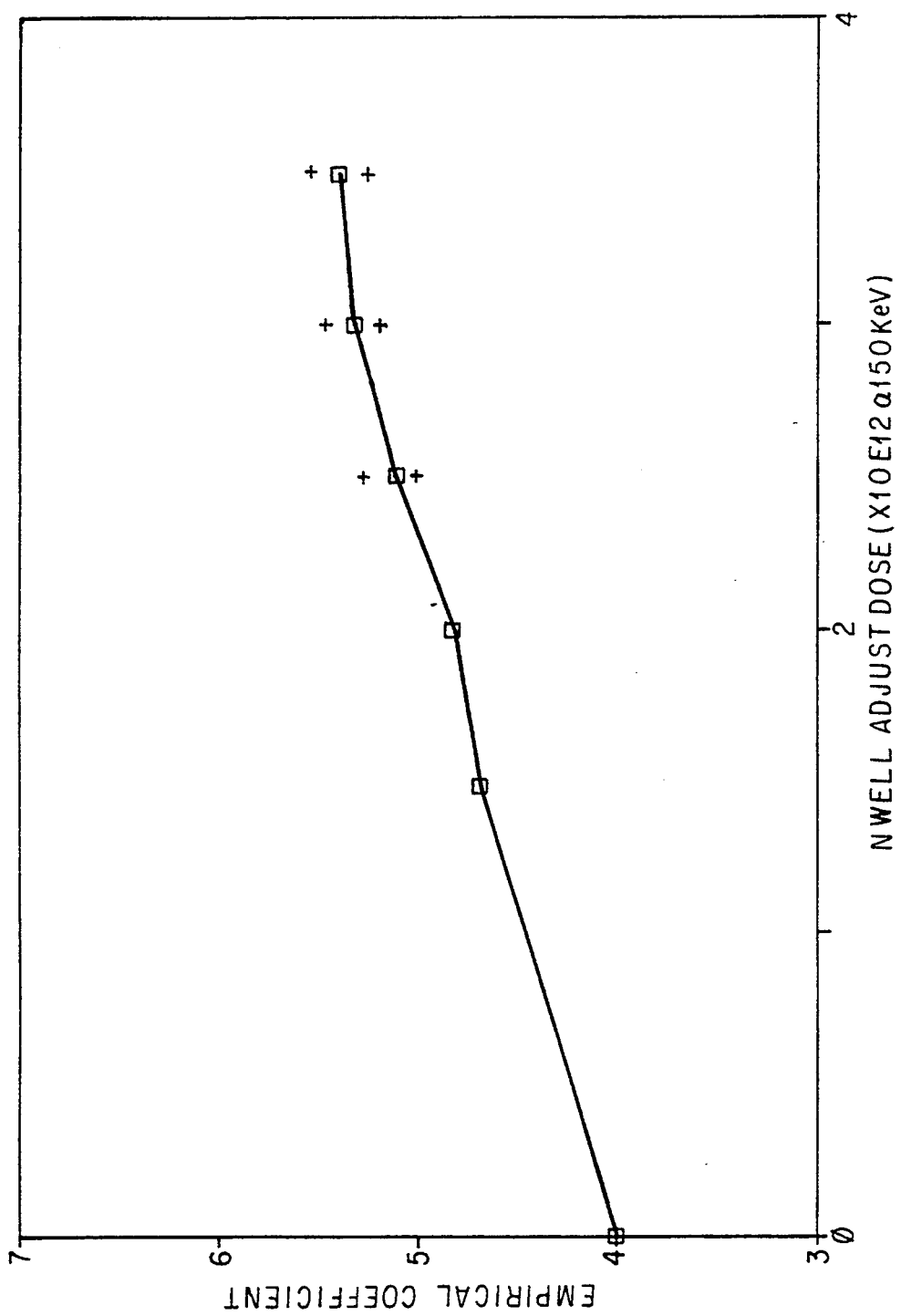
Figure 19:
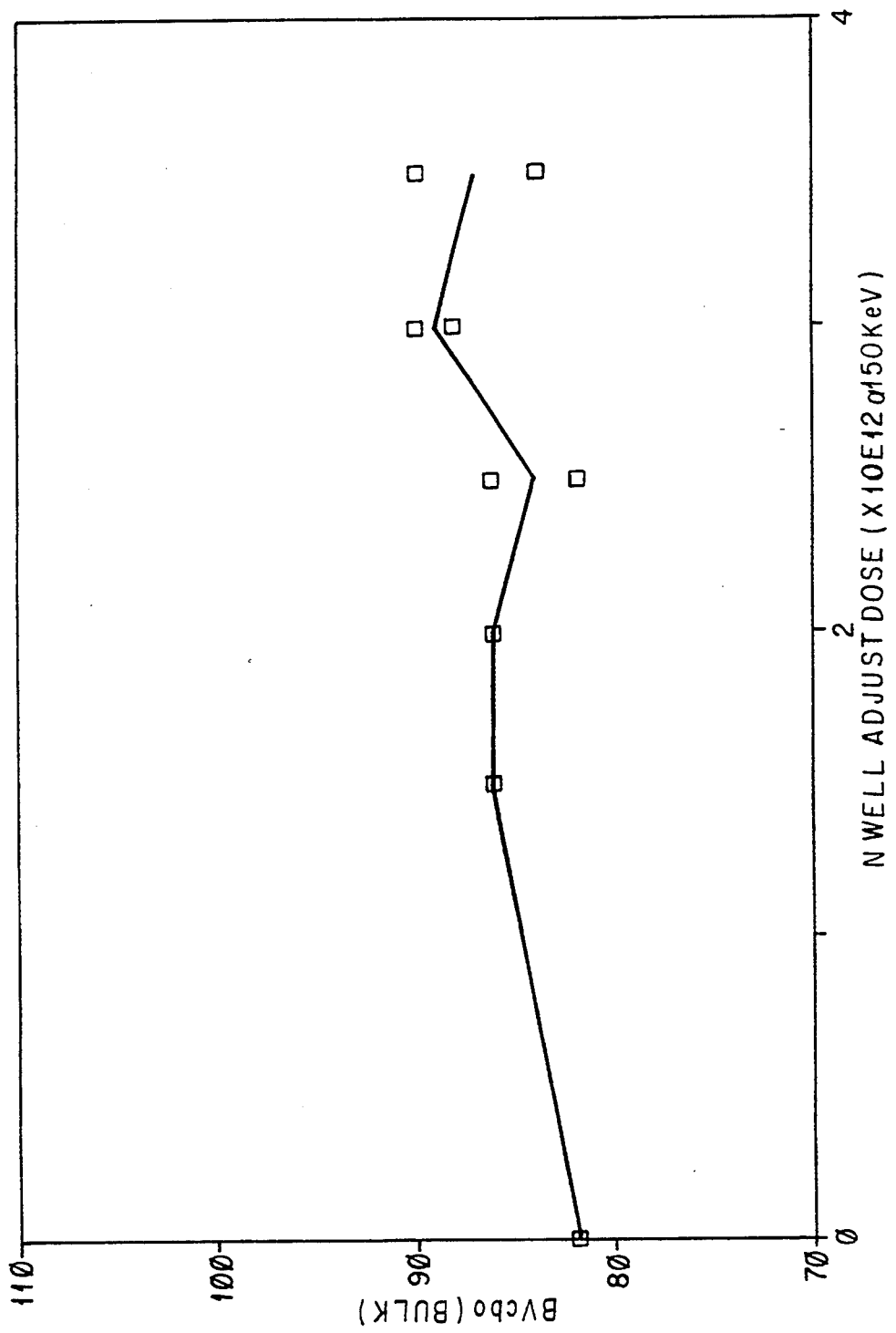
Figure 20:
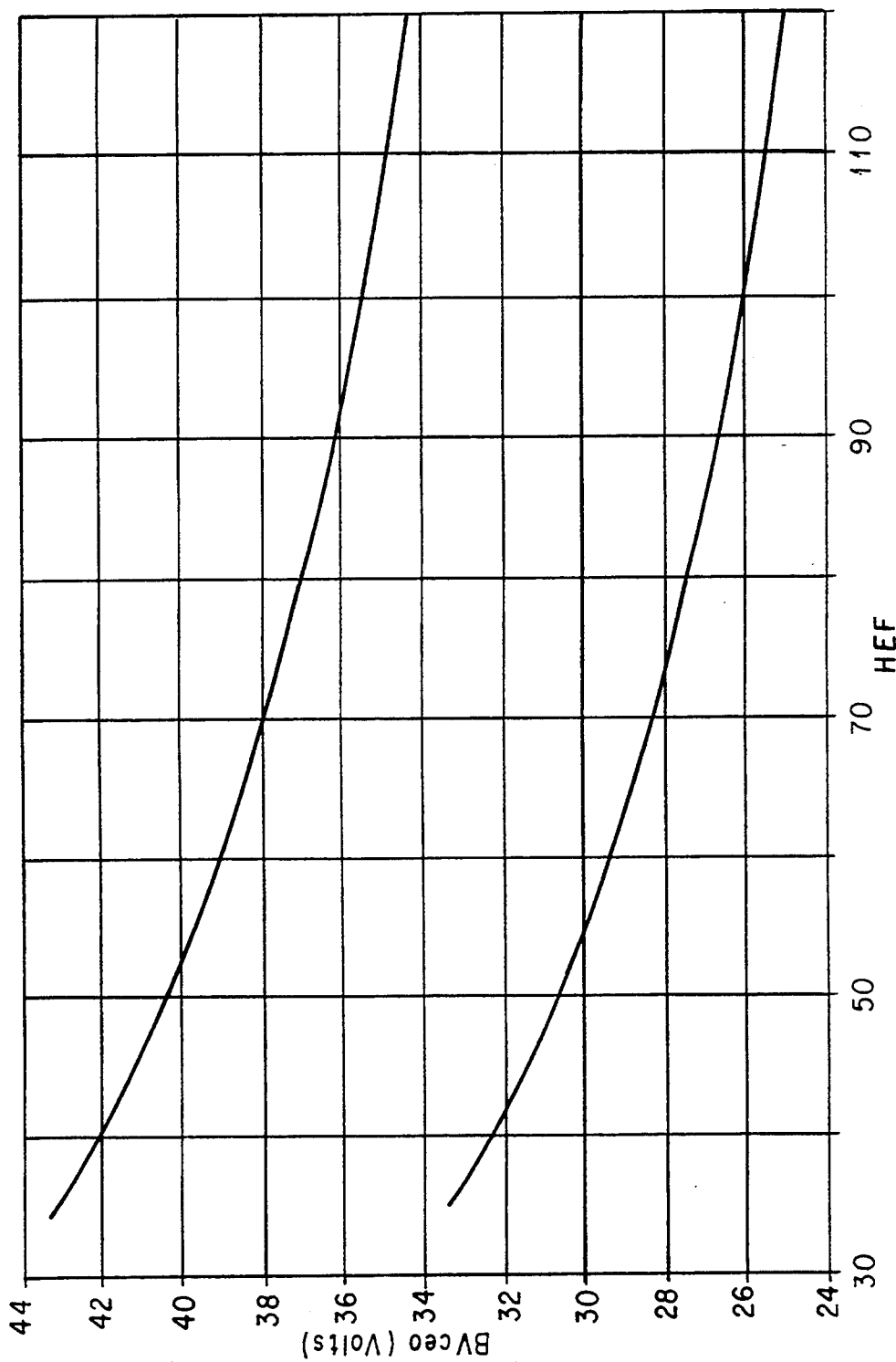

FIGS. 18–20 illustrate data taken from wafers processed utilizing the nwell adjust technique of the present invention to increase the operating voltage (BVceo) of the NPN device. As shown in FIG. 18, the empirical constant n increased from about 4 with no nwell adjust, to about 5.4 with an adjust dosage of about 3.5e12 atoms/cm$^2$ implanted at an energy of 150 KeV. FIG. 19 illustrates the change in value of BVcbo(bulk) resulting from changes in the nwell adjust dosage. As the modelling data indicated, the BVcbo(bulk) is increased, but is not greatly impacted by the nwell adjust technique of the present invention. With respect to the hFE, it has been determined through test material that the hFE is decreased from the standard material. The impact is on the order of a 10% reduction throughout the specification range.

FIG. 20 is a plot of BVceo vs. hFE. This plot should follow the relationship stated in equation (1). The bottom line depicts the standard NPN transistor when processed with the standard BiCMOS process. Utilizing data from FIG. 18 for the n value, and from FIG. 19 for the BVcbo(bulk), a curve can be predicted for a higher-voltage NPN using an nwell adjust dose of 2.5E12 atoms/cm$^2$ at an implant energy of 150 Kev. The predicted result is indicated by the top curve. As can be seen, the nwell adjust technique of the present invention does produce a higher operating voltage, and the device does follow the relationship given by equation (1).

Figure 21A:
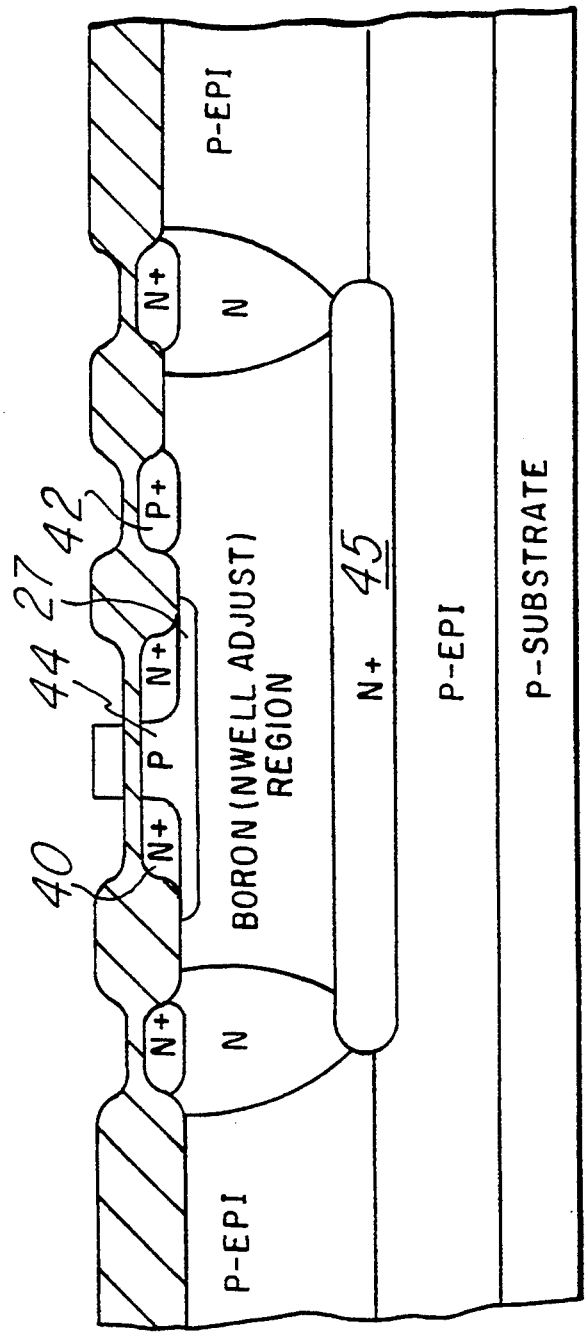
FIGS. 21a, 21b, 21c illustrate NPN transistors made in accordance with three alternative embodiments of the present invention.

An alternative embodiment of the present invention is shown in FIG. 21(a), where the technique has been used to change the operating voltage of an isolated NMOS transistor. In a standard Nwell BiCMOS process, the backgate of the NMOS transistor is electrically connected to the substrate. This can result in digital switching noise being coupled into sensitive analog circuit nodes, leading to degraded performance in mixed-mode circuits. Previously, a technique for isolating NMOS transistors in an Nwell BiCMOS process has been proposed by Tomassetti (U.S. Pat. No. 4,825,275), which is incorporated by reference herein. However, this technique suffers from a low vertical punch-through breakdown margin between the N+ source/drain regions and the isolating N+BL (N+ buried layer) diffusion, since the p-type epi used in these processes is often relatively lightly doped (approximately 2e15 atoms/cm$^3$) and thin (8.5 μm).

Figure 22:
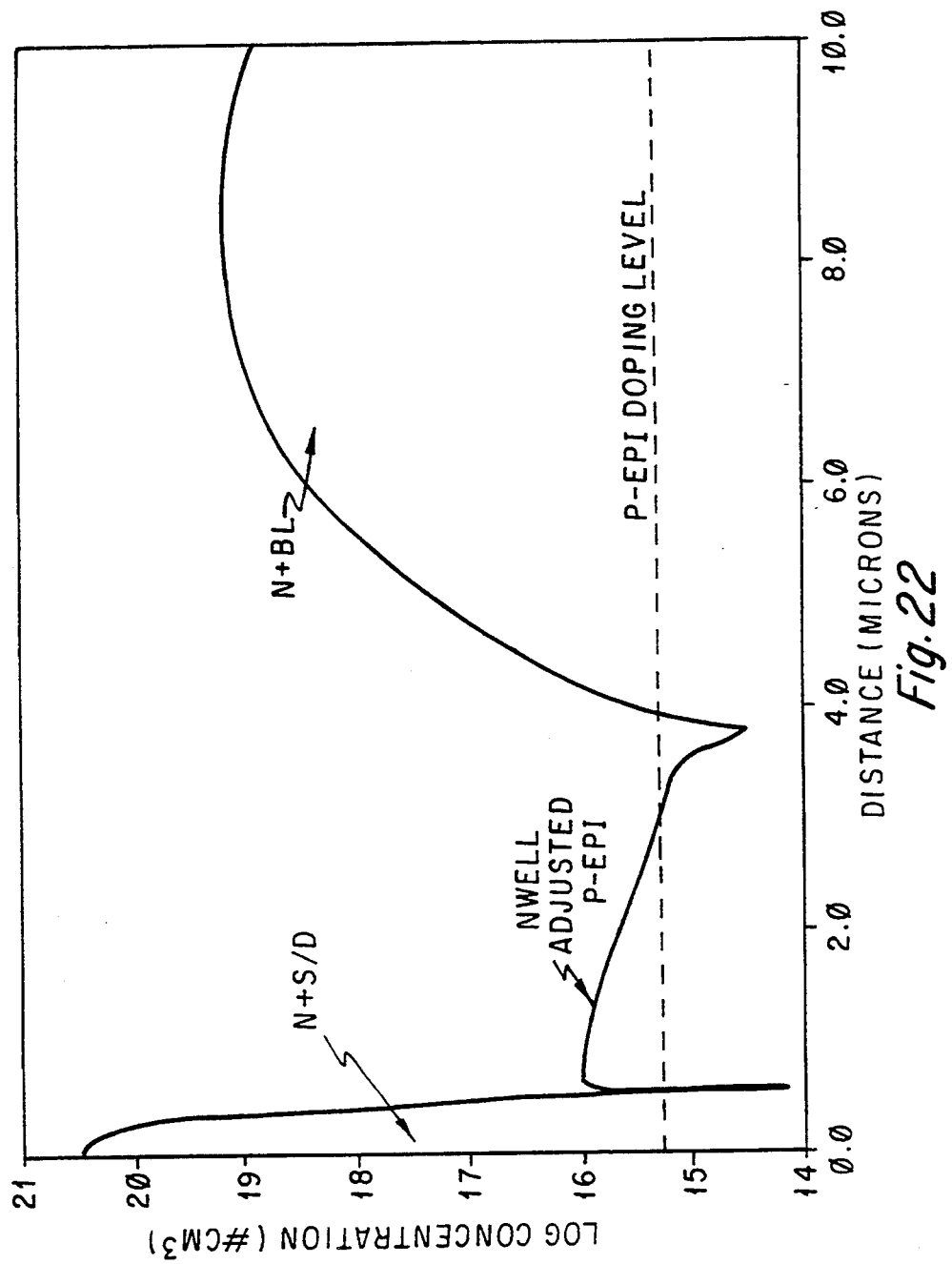
FIG. 22 shows the doping profile of the transistor of FIG. 21(a) vertically through the channel region.
Figure 23:
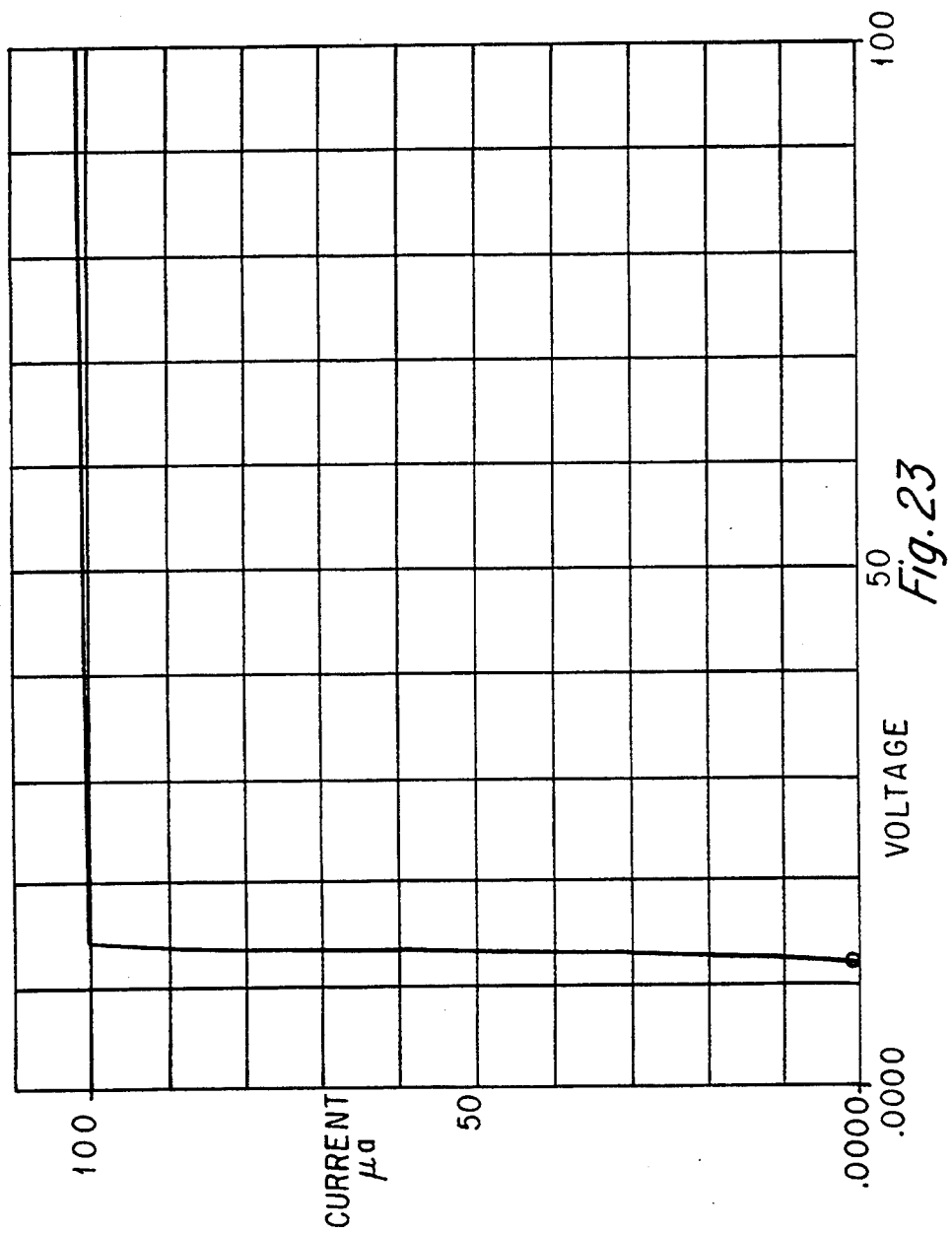
FIG. 23 shows the characteristics of an isolated NMOS transistor made in accordance with the prior art.

The addition of the Nwell adjust of the present invention to the structure described in U.S. Pat. No. 4,825,275 can increase the vertical p-type doping, as shown in FIG. 22. The increased doping acts as a vertical punch-through stop. Referring to FIG. 21(a), the Nwell adjust region 27 extends laterally to completely include source/drain regions 40 and 42. FIG. 23 shows the punch-through breakdown voltage for a standard (no Nwell adjust) isolated NMOS, while FIG. 24 shows the same plot for an isolated NMOS device with an Nwell adjust of 3.5e12 atoms/cm$^2$ at an energy of 150 Kev. As can be seen, the addition of the Nwell adjust implant increases the vertical punch-through breakdown voltage by over 50 V.

There is also disclosed a method for making a shorter channel NMOS transistor compared to what can normally be built in a similarly lightly doped p-epi region (2e15 atoms/cm3). The increased dopant concentration of the nwell adjust region reduces the lateral punch-through between the source and drain regions, allowing the channel length of the transistor to be reduced for faster digital switching speed and higher packing density. With the standard p-epi doping levels of 2e15 atoms/cm3, the shortest NMOS channel length is approximately 2.0 micron. However, by using the alternative embodiment of the present invention, the surface concentration is increased to 2E16 atoms/cm3, which will advantageously allow a reduction in the channel length to approximately 1.0 micron.

Figure 21B:
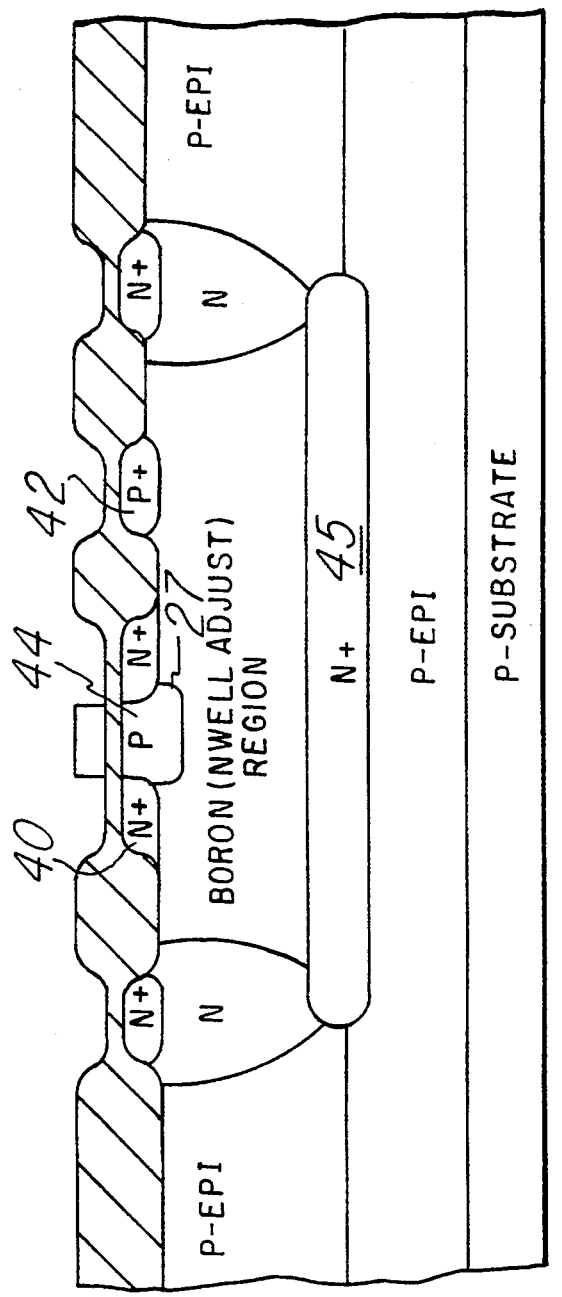

This configuration of the nwell adjust region is shown in FIG. 21(b). The lateral extent of the nwell adjust region 27 extends only beyond the channel region 44, and only partially overlaps source and drain regions 40 and 42. Since the concern with this embodiment is lateral punch-through between source and drain, it is not necessary to form the adjust region 26 entirely between the source 40 and drain 42 and the N+ buried layer 45 to prevent vertical punch-through to the N+ buffed layer 45. It is preferable in this embodiment to limit the lateral diffusion of adjust region 27 to keep it from the outer edges of source 40 and drain 42 to prevent leakage current. By limiting the adjust region 27 to the NMOS channel region, it also advantageously reduces junction capacitance, since larger heavier doped regions lead to higher capacitances. It is also possible to use this technique in standard non-isolated NMOS transistors.

Figure 21C:
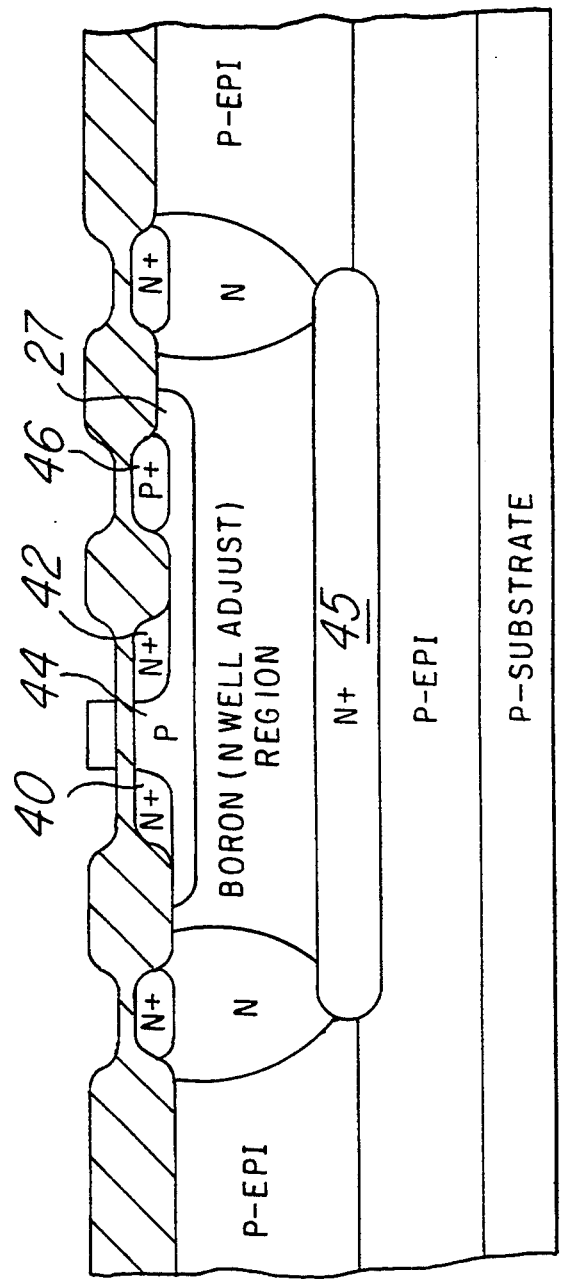

Yet another embodiment is shown in FIG. 21(c). In this embodiment, the nwell adjust region 27 is larger, and extends laterally to surround the P+ source/drain (backgate) region 46. By laterally extending the adjust region 27 beyond the backgate region 46, the series resistance can be much lower. In an isolated p-epi structure the series resistance is normally very high. The resistivity is normally in the 6 ohm-cm range with the standard p-epi doping level of about 2E15 atoms/cm3. Due to the N+ DUF up-diffusion of the isolated region, the actual isolated epi thickness will be only about 4 micron, since the up-diffusion is about 4.5 micron into the 8.5 micron epi thickness. This corresponds to an isolated epi sheet resistance of about 15000 ohm/square. Using this alternative embodiment of the present invention, with a preferred dopant level of approximately 2E16 atoms/cm3, the Nwell Adjust advantageously reduces this sheet resistance to approximately 1500 ohms/sq, or about one-tenths. Reducing the series resistance advantageously reduces debiasing when current is flowing in the backgate.

It is thus a technical advantage of the present invention that the operating voltage of NPN devices in a standard BiCMOS process can be increased by the insertion of the high voltage process module without disruption of the standard process flow. It is a further technical advantage of the present invention that the high-voltage process module requires only one additional mask step. It is yet a further technical advantage of the present invention that it can be added to isolated NMOS structures to increase the vertical punch-through breakdown voltage. Another technical advantage is that isolated or standard non-isolated NMOS transistors having shorter channel lengths can be built, increasing packing density as well as switching speed Although the invention has been described with respect to specific preferred embodiments thereof, many variations and modifications will become apparent to those skilled in the art. It is therefore intended that the appended claims be interpreted as broadly as possible in view of the prior art to include all such variations and modifications.

TABLE 1

Standard BiCMOS Process Flow

| | |
|---|---|
| 1. | DUF Processing |
| 2. | P-Epi Processing |
| 3. | Nwell Processing |
| 4. | N+ Processing |
| | A. N+ OR |
| | B. N+ deposition |
| | C. N+ diffusion |
| 5. | Base Processing |
| 6. | LOCOS Processing |
| 7. | Gate Ox and Poly-1 Processing |
| 8. | Capacitor Processing |
| 9. | LDD/Sidewall Processing |
| 10. | Source/Drain Processing |
| 11. | Emitter Processing |
| 12. | Interconnect Processing |
| 13. | Passivation Processing |

TABLE 2

High-Voltage NPN BiCMOS Process Flow

| | |
|---|---|
| 1. | DUF Processing |
| 2. | P-Epi Processing |
| 3. | Nwell Processing |
| 4. | N+ and High-Voltage NPN Processing |
| | A. N+ OR |
| | B. N+ deposition |
| | ←Nwell Adjust OR |
| | ←Nwell Adjust implant |
| | ←TEOS deposition |
| | C. N+ diffusion |
| 5. | Base Processing |
| 6. | LOCOS Processing |
| 7. | Gate Ox and Poly-1 Processing |
| 8. | Capacitor Processing |
| 9. | LDD/Sidewall Processing |
| 10. | Source/Drain Processing |
| 11. | Emitter Processing |
| 12. | Interconnect Processing |
| 13. | Passivation Processing |

We claim:

1. A method for increasing the operating voltage of a transistor formed on a substrate of a first conductivity type, comprising the steps of:
    forming a region of a second conductivity type in a surface of the substrate;
    forming a first region of the first conductivity type in the region of the second conductivity type, said first region extending to a first depth in said region of the second conductivity type;
    forming a second region of the first conductivity type in the region of the second conductivity type, the second region extending to a second depth greater than said first depth in said region of the second conductivity type and containing the first region, the first region having a doping profile that reduces the dopant concentration of said region of a second conductivity type adjacent said second region; and
    forming a region of the second conductivity type in the first region of the first conductivity type.

2. The method of claim 1, wherein the step of forming the first region further comprises the steps of:
    implanting an impurity of the first conductivity type into an area of the region of the second conductivity type.

3. The method of claim 1 in which said second region is more heavily doped than said first region.

4. A method of forming a bipolar transistor on a substrate of a first conductivity type, comprising the steps of:
    forming a collector region of the second conductivity type in the substrate;
    forming a region of the first conductivity type in the collector region;

forming a base region of the first conductivity type in the collector region, said base region containing the region of the first conductivity type; and forming an emitter region of the second conductivity type in the region of the first conductivity type.

5. The method of claim 4, wherein the base region extends into the collector region to a depth greater than the region of the first conductivity type.

6. The method of claim 4 in which said base region is more heavily doped than said region of the first conductivity type.

7. The method of claim 4 in which the region of the first conductivity type has a doping profile that reduces the dopant concentration of said collector region adjacent said base region.

* * * * *